(12) United States Patent
Li et al.

(10) Patent No.: US 11,070,237 B2
(45) Date of Patent: Jul. 20, 2021

(54) PARITY BIT CHANNEL ASSIGNMENT FOR POLAR CODING

(71) Applicant: QUALCOMM Incorporated, San Diego, CA (US)

(72) Inventors: Jian Li, Beijing (CN); Changlong Xu, Beijing (CN); Chao Wei, Beijing (CN); Jilei Hou, San Diego, CA (US); Jing Jiang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/487,242

(22) PCT Filed: Mar. 23, 2017

(86) PCT No.: PCT/CN2017/077868
§ 371 (c)(1),
(2) Date: Aug. 20, 2019

(87) PCT Pub. No.: WO2018/170834
PCT Pub. Date: Sep. 27, 2018

(65) Prior Publication Data
US 2020/0007160 A1 Jan. 2, 2020

(51) Int. Cl.
*H03M 13/29* (2006.01)
*H03M 13/13* (2006.01)
(Continued)

(52) U.S. Cl.
CPC ....... *H03M 13/2906* (2013.01); *H03M 13/09* (2013.01); *H03M 13/13* (2013.01);
(Continued)

(58) Field of Classification Search
CPC .. H03M 13/2906; H03M 13/13; H03M 13/09; H03M 13/2963; H03M 13/6393;
(Continued)

(56) References Cited

U.S. PATENT DOCUMENTS 9,917,675 B2  3/2018  Kudekar et al.
9,973,301 B2  5/2018  Raza et al.
(Continued)

FOREIGN PATENT DOCUMENTS

EP       1601109 A3      10/2007
WO    2018108247 A1       6/2018
WO   WO-2018146554 A1     8/2018

OTHER PUBLICATIONS

International Search Report and Written Opinion—PCT/CN2017/077868—ISA/EPO—dated Jun. 2, 2017.
(Continued)

*Primary Examiner* — Cynthia Britt
(74) *Attorney, Agent, or Firm* — Terry Tsai

(57) ABSTRACT

Methods, systems, and devices for wireless communication are described that support channel selection for parity bits in polar coding techniques. In some cases, an encoder or decoder of a wireless device may assign information bits, frozen bits, and parity check bits to polar channels of an encoder or decoder based on reliability metrics. The information bits may initially be assigned and based on a channel index of the first information bit, the parity check bits may be assigned to channels having higher channel indices than the first information bit. After assignment, the bits may be encoded or decoded.

28 Claims, 12 Drawing Sheets

(51) Int. Cl.
  *H03M 13/09* (2006.01)
  *H04L 1/00* (2006.01)
  *H03M 13/00* (2006.01)
  *H03M 13/15* (2006.01)

(52) U.S. Cl.
  CPC ... *H03M 13/2963* (2013.01); *H03M 13/6393* (2013.01); *H03M 13/6561* (2013.01); *H04L 1/0057* (2013.01); *H04L 1/0061* (2013.01); *H03M 13/152* (2013.01)

(58) Field of Classification Search
  CPC ............ H03M 13/6561; H03M 13/152; H04L 1/0057; H04L 1/0061
  See application file for complete search history.

(56) References Cited

U.S. PATENT DOCUMENTS

| | | | |
|---|---|---|---|
| 10,224,966 | B2 | 3/2019 | Li et al. |
| 10,333,552 | B2 | 6/2019 | Shen et al. |
| 10,383,106 | B2 | 8/2019 | Shelby et al. |
| 10,440,659 | B2 | 10/2019 | Jang et al. |
| 10,491,326 | B2 | 11/2019 | Zhang et al. |
| 10,554,223 | B2 | 2/2020 | Ge |
| 2005/0149842 | A1 | 7/2005 | Kyung et al. |
| 2009/0158129 | A1 | 6/2009 | Myung et al. |
| 2014/0108748 | A1 | 4/2014 | Lee et al. |
| 2015/0333775 | A1 | 11/2015 | Korb et al. |
| 2016/0013810 | A1 | 1/2016 | Gross et al. |
| 2017/0047947 | A1 | 2/2017 | Hong et al. |
| 2017/0353267 | A1 | 12/2017 | Kudekar et al. |
| 2017/0353271 | A1 | 12/2017 | Kudekar et al. |
| 2018/0115393 | A1 | 4/2018 | Zhang et al. |
| 2018/0248567 | A1 | 8/2018 | Qu et al. |
| 2018/0278272 | A1 | 9/2018 | Li et al. |
| 2018/0375532 | A1 | 12/2018 | Ge et al. |
| 2019/0028241 | A1 | 1/2019 | Ahn et al. |
| 2019/0068316 | A1* | 2/2019 | Zhang .................. H04L 1/0009 |
| 2019/0165889 | A1 | 5/2019 | Hwang et al. |
| 2019/0190655 | A1 | 6/2019 | Pan et al. |
| 2019/0207720 | A1* | 7/2019 | Li ........................ H03M 13/13 |
| 2019/0334553 | A1 | 10/2019 | Wang et al. |
| 2019/0349009 | A1 | 11/2019 | Zhang et al. |
| 2019/0349128 | A1 | 11/2019 | Zhou et al. |
| 2019/0363826 | A1* | 11/2019 | Qiao ........................ H04L 1/00 |
| 2020/0228236 | A1* | 7/2020 | Xi .......................... H04L 1/0061 |

OTHER PUBLICATIONS

Huawei: "Details of the Polar code design", 3GPP TSG RAN WG1 Meeting #87, R1-1611254, Reno, USA, Nov. 10-14, 2016, 15 pages.
Huawei et al., "Details of the Polar Code Design", 3GPP TSG RAN WG1 Meeting #87, R1-1611254, Nov. 10-14, 2016, 15 pages.
Li Y., et al., "A Study of Polar Codes for MLC NAND Flash Memories," International Conference on Computing, Networking and Communications (ICNC), 2015, 5 pages.
Li Y., et al., "A Study of Polar Codes for MLC NAND Flash Memories", International Conference on Computing, Networking and Communications (ICNC), Feb. 2015.
Yaacoub C., et al., "Systematic Polar Codes for Joint Source-Channel Coding in Wireless Sensor Networks and the Internet of Things," The 12th International Conference on Future Networks and Communications, Procedia Computer Science, 2017, vol. 110, pp. 266-273.
Huawei, et al., "Channel Coding for Very Small Control Block Lengths", 3GPP Draft, 3GPP TSG RAN WG1 NR Ad-Hoc Meeting, R1-1700091 Channel Coding for Very Small Control Block Lengths, 3rd Generation Partnership Project (3GPP), Mobile Competence Centre, 650, Route Des Lucioles, F-06921 Sophia-Antipolis Ced, vol. RAN WG1, No. Spokane, USA, Jan. 16, 2017-Jan. 20, 2017, Jan. 10, 2017 (Jan. 10, 2017), XP051202600, 7 Pages, Retrieved from the Internet: URL: http://www.3gpp.org/ftp/tsg_ran/WG1_RL1/TSGR1_AH/NR_AH_1701/Docs/, [retrieved on Jan. 10, 2017].
Huawei, et al., "Summary of Polar Code Design for Control Channels", 3GPP draft, R1-1700088 Summary of Polar Code Design for Control Channels, 3rd Generation Partnership Project (3GPP), Mobile Competence Centre, 650, Route Des Lucioles, F-06921 Sophia-Antipolis Cedex, vol. RAN WG1, No. Spokane, USA, Jan. 16, 2017-Jan. 20, 2017, Jan. 16, 2017 (Jan. 16, 2017), XP051207630, 10 pages, Retrieved from the Internet: URL: http://www.3gpp.org/ftp/Meetings_3GPP_sync/ran1/Docs/, [retrieved on Jan. 16, 2017].
Supplementary European Search Report—EP17901737—Search Authority—Munich—dated Oct. 9, 2020.
Wang T., et al., "Parity-Check-Concatenated Polar Codes", IEEE Communications Letters, IEEE Service Center, Piscataway, NJ, US, vol. 20, No. 12, Dec. 1, 2016, pp. 2342-2345, XP011636292, ISSN: 1089-7798, DOI: 10.1109/lcomm.2016.2607169 [retrieved on Dec. 8, 2016].

* cited by examiner

PARITY BIT CHANNEL ASSIGNMENT FOR POLAR CODING

CROSS REFERENCE

The present application is a 371 national phase filing of International Application No. PCT/CN2017/077868 to Li et al., entitled "PARITY BIT CHANNEL ASSIGNMENT FOR POLAR CODING", filed Mar. 23, 2017, assigned to the assignee hereof, and expressly incorporated herein.

BACKGROUND

The following relates generally to wireless communication, and more specifically to parity bit channel assignment for polar coding.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system). A wireless multiple-access communications system may include a number of base stations or access network nodes, each simultaneously supporting communication for multiple communication devices, which may be otherwise known as user equipment (UE).

In some wireless communication systems, a transmitting device such as a UE or base station may encode information bits of an input vector to obtain a codeword for transmission. The transmitting device may use an error correcting code or parity check bits so that transmission errors may be detected or corrected by the receiving device. The encoding may be performed using a polar coding technique, which may be computationally complex and resource intensive, consequently leading to latency issues or unsuccessful decoding of a received codeword.

SUMMARY

The described techniques relate to improved methods, systems, devices, or apparatuses that support parity bit channel assignment for polar coding. Generally, the described techniques provide for flexible polar channel selection (e.g., the number of polar channels, channel index) for parity check bits in polar coding. The techniques may be used by a wireless device in a wireless communications system and may involve assigning information bits, frozen bits, and/or parity check bits to polar channels of a polar encoder or decoder based on reliability metrics associated with respective polar channels. Based on the channel index of the first information bit of multiple information bits, parity check bits may be assigned to polar channels having a higher channel index than the channel index of the first information bit. Such techniques, when used in a polar encoding process, may improve decoding performance by using a reduced number of parity check bits, but still maintaining an acceptable block error rate (BLER).

A method for wireless communication is described. The method may include identifying a set of information bits and a set of parity check bits for encoding, determining, from a set of polar channels, a first channel for a first information bit of the set of information bits based at least in part on respective reliability metrics for the set of polar channels, determining, based at least in part on an index of the first channel, a second channel from the set of polar channels for a first parity check bit of the set of parity check bits, wherein an index of the second channel is greater than the index of the first channel, encoding at least the first information bit and the first parity check bit based at least in part on the first channel and the second channel, and transmitting a codeword comprising the encoded first information bit and the first parity check bit.

An apparatus for wireless communication is described. The apparatus may include means for identifying a set of information bits and a set of parity check bits for encoding, means for determining, from a set of polar channels, a first channel for a first information bit of the set of information bits based at least in part on respective reliability metrics for the set of polar channels, means for determining, based at least in part on an index of the first channel, a second channel from the set of polar channels for a first parity check bit of the set of parity check bits, wherein an index of the second channel is greater than the index of the first channel, means for encoding at least the first information bit and the first parity check bit based at least in part on the first channel and the second channel, and means for transmitting a codeword comprising the encoded first information bit and the first parity check bit.

Another apparatus for wireless communication is described. The apparatus may include a processor, memory in electronic communication with the processor, and instructions stored in the memory. The instructions may be operable to cause the processor to identify a set of information bits and a set of parity check bits for encoding, determine, from a set of polar channels, a first channel for a first information bit of the set of information bits based at least in part on respective reliability metrics for the set of polar channels, determine, based at least in part on an index of the first channel, a second channel from the set of polar channels for a first parity check bit of the set of parity check bits, wherein an index of the second channel is greater than the index of the first channel, encode at least the first information bit and the first parity check bit based at least in part on the first channel and the second channel, and transmit a codeword comprising the encoded first information bit and the first parity check bit.

A non-transitory computer readable medium for wireless communication is described. The non-transitory computer-readable medium may include instructions operable to cause a processor to identify a set of information bits and a set of parity check bits for encoding, determine, from a set of polar channels, a first channel for a first information bit of the set of information bits based at least in part on respective reliability metrics for the set of polar channels, determine, based at least in part on an index of the first channel, a second channel from the set of polar channels for a first parity check bit of the set of parity check bits, wherein an index of the second channel is greater than the index of the first channel, encode at least the first information bit and the first parity check bit based at least in part on the first channel and the second channel, and transmit a codeword comprising the encoded first information bit and the first parity check bit.

In some examples of the method, apparatus, and non-transitory computer-readable medium described above, determining the second channel comprises: determining respective reliability metrics for a subset of the set of polar channels having respective channel indices greater than the index of the first channel and selecting the second channel from the subset of the set of polar channels based at least in part on the respective reliability metrics.

In some examples of the method, apparatus, and non-transitory computer-readable medium described above, the second channel may be associated with a first reliability metric that may be greater than a second reliability metric associated with at least one other channel of the subset of the set of polar channels.

In some examples of the method, apparatus, and non-transitory computer-readable medium described above, a number of the set of parity check bits corresponds to half of a number of channels having respective channel indices greater than the index of the first channel.

In some examples of the method, apparatus, and non-transitory computer-readable medium described above, a number of the set of parity check bits may be less than or equal to a number of channels having respective channel indices greater than the index of the first channel.

Some examples of the method, apparatus, and non-transitory computer-readable medium described above may further include processes, features, means, or instructions for determining, based at least in part on the index of the first channel, respective channels of the set of polar channels for each parity check bit of the set of parity check bits. Some examples of the method, apparatus, and non-transitory computer-readable medium described above may further include processes, features, means, or instructions for encoding each parity check bit based at least in part on the respective channels.

In some examples of the method, apparatus, and non-transitory computer-readable medium described above, each index of the respective channels may be greater than the index of the first channel.

In some examples of the method, apparatus, and non-transitory computer-readable medium described above, a reliability metric associated with a third channel of the set of polar channels may be greater than a reliability metric associated with the second channel.

A method for wireless communication is described. The method may include receiving a codeword comprising a set of information bits and a set of parity check bits, determining, from a set of polar channels, a first channel assigned to a first information bit of the set of information bits based at least in part on respective reliability metrics for the set of polar channels, determining, based at least in part on an index of the first channel, a second channel from the set of polar channels for a first parity check bit of the set of parity check bits, wherein an index of the second channel is greater than the index of the first channel, and decoding at least the first information bit and the first parity check bit based at least in part on the first channel and the second channel.

An apparatus for wireless communication is described. The apparatus may include means for receiving a codeword comprising a set of information bits and a set of parity check bits, means for determining, from a set of polar channels, a first channel assigned to a first information bit of the set of information bits based at least in part on respective reliability metrics for the set of polar channels, means for determining, based at least in part on an index of the first channel, a second channel from the set of polar channels for a first parity check bit of the set of parity check bits, wherein an index of the second channel is greater than the index of the first channel, and means for decoding at least the first information bit and the first parity check bit based at least in part on the first channel and the second channel.

Another apparatus for wireless communication is described. The apparatus may include a processor, memory in electronic communication with the processor, and instructions stored in the memory. The instructions may be operable to cause the processor to receive a codeword comprising a set of information bits and a set of parity check bits, determine, from a set of polar channels, a first channel assigned to a first information bit of the set of information bits based at least in part on respective reliability metrics for the set of polar channels, determine, based at least in part on an index of the first channel, a second channel from the set of polar channels for a first parity check bit of the set of parity check bits, wherein an index of the second channel is greater than the index of the first channel, and decode at least the first information bit and the first parity check bit based at least in part on the first channel and the second channel.

A non-transitory computer readable medium for wireless communication is described. The non-transitory computer-readable medium may include instructions operable to cause a processor to receive a codeword comprising a set of information bits and a set of parity check bits, determine, from a set of polar channels, a first channel assigned to a first information bit of the set of information bits based at least in part on respective reliability metrics for the set of polar channels, determine, based at least in part on an index of the first channel, a second channel from the set of polar channels for a first parity check bit of the set of parity check bits, wherein an index of the second channel is greater than the index of the first channel, and decode at least the first information bit and the first parity check bit based at least in part on the first channel and the second channel.

In some examples of the method, apparatus, and non-transitory computer-readable medium described above, determining the second channel comprises: determining respective reliability metrics for a subset of the set of polar channels having respective channel indices greater than the index of the first channel and selecting the second channel from the subset of the set of polar channels based at least in part on the respective reliability metrics.

In some examples of the method, apparatus, and non-transitory computer-readable medium described above, the second channel may be associated with a first reliability metric that may be greater than a second reliability metric associated with at least one other channel of the subset of the set of polar channels.

In some examples of the method, apparatus, and non-transitory computer-readable medium described above, a number of the set of parity check bits corresponds to half of a number of channels having respective channel indices greater than the index of the first channel.

In some examples of the method, apparatus, and non-transitory computer-readable medium described above, a number of the set of parity check bits may be less than or equal to a number of channels having respective channel indices greater than the index of the first channel.

Some examples of the method, apparatus, and non-transitory computer-readable medium described above may further include processes, features, means, or instructions for determining, based at least in part on the index of the first channel, respective channels of the set of polar channels for each parity check bit of the set of parity check bits. Some examples of the method, apparatus, and non-transitory computer-readable medium described above may further include processes, features, means, or instructions for decoding each parity check bit based at least in part on the respective channels.

In some examples of the method, apparatus, and non-transitory computer-readable medium described above, each index of the respective channels may be greater than the index of the first channel.

In some examples of the method, apparatus, and non-transitory computer-readable medium described above, a reliability metric associated with a third channel of the set of polar channels may be greater than a reliability metric associated with the second channel.

DETAILED DESCRIPTION

Figure 1:
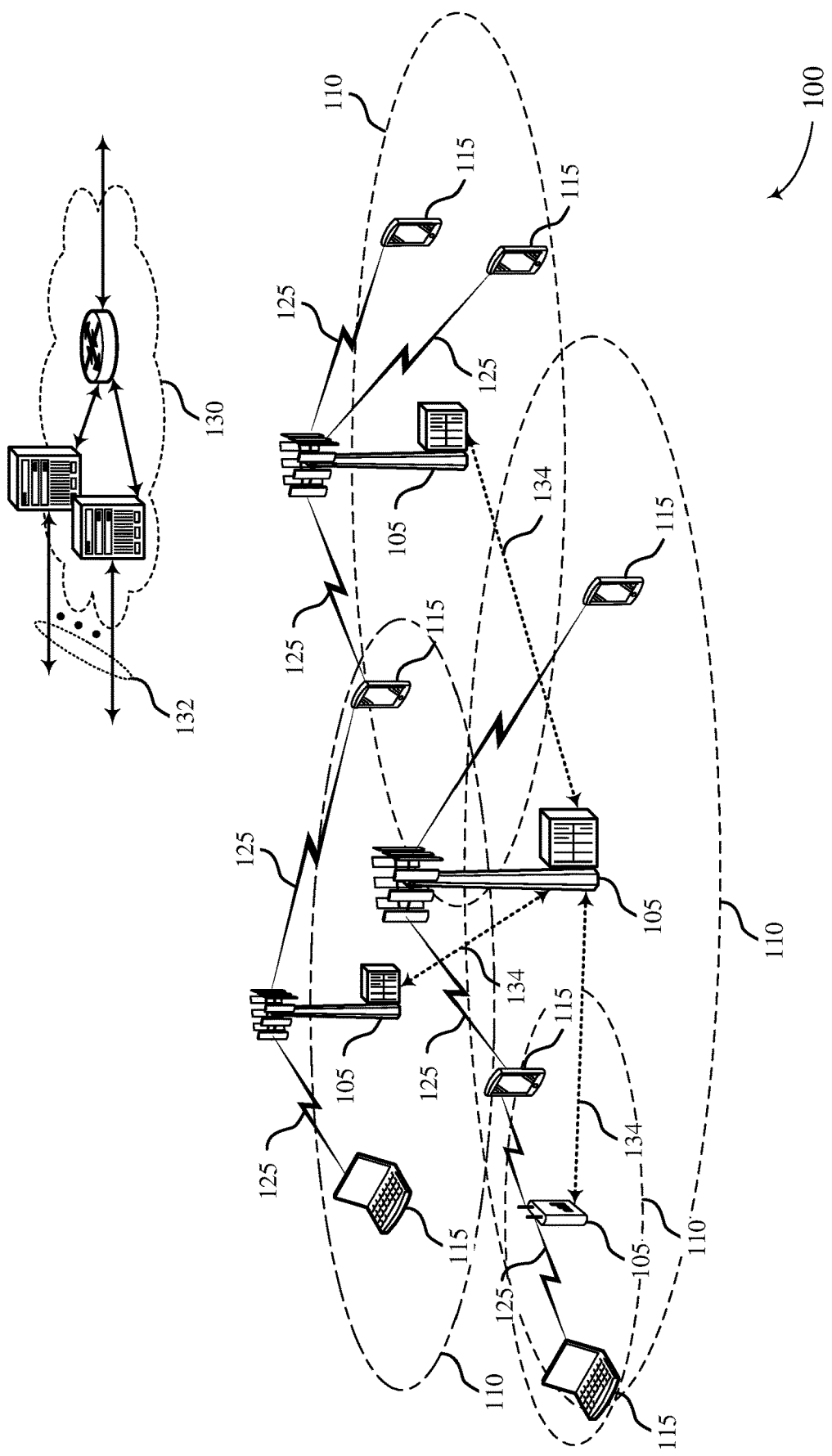
FIG. 1 illustrates an example of a system for wireless communication that supports parity bit channel assignment for polar coding in accordance with aspects of the present disclosure.

Because of the lossy nature of wireless channels, transmitting devices, e.g., base stations or user equipment (UES), employ error correcting codes that enable receiving devices to detect and correct transmission errors. The error correcting codes introduce redundancy into blocks of encoded bits, and this redundancy can be used to correct corrupted bits resulting from the lossy channels. Parity check bits may be used along with frozen bits in polar coding techniques for error correction. Parity check bit values are dynamically and deterministically set based on the value of information bits to be encoded. Because of their deterministic nature, parity check bits can be used to facilitate polar decoding in the same way as frozen bits, which have static values. For this reason, some polar coding techniques use parity check bits dynamic frozen bits.

In some examples, the weight distribution of a codeword to be transmitted may be optimized by the inclusion of parity check bits, in order to facilitate the decoding performance. In some other cases, the use of parity check bits may allow for earlier pruning of a selected candidate path, which may also improve decoding performance. Unlike cyclic redundancy check (CRC) bits, which may be used for CRC aided successive cancellation list (CA-SCL) decoding, parity check bits may not be considered overhead. For instance, in some cases, parity check bits may be decoded in a decoder (e.g., by a processor of the decoder), whereas a CRC bit may be decoded and/or verified after decoding the remainder of the codeword. In some cases, the number of parity check bits may play a role in the performance of CA-SCL decoding. For example, the larger the number of parity check bits, the more robust the CA-SCL decoding performance.

In some examples, polar codes may be constructed by determining or assigning one of a parity check bit, a frozen bit, a CRC bit, or an information bit to each polar channel from a set of polar channels of the encoder or decoder. The assigning may be based on respective reliability metrics associated with the polar channels. In some cases, a multi-step process may involve sorting the polar channels according to their reliability, selecting the most reliable polar channels for assignment of information bits. Based on a channel index associated with one or more of the information bits (e.g., the lowest channel index assigned to an information bit or channel index associated with the least reliable channel assigned to an information bit), parity check bits may be assigned. For example, an encoder may select one or more polar channels (e.g., a value 'P') whose indices are greater than the channel index of the polar channel for the first information bit. The encoder may select the 'P' polar channels for parity check bits. In some cases, the number of parity check bits 'P' may be selected as a constant value (e.g., 2, 4, 8, 16, 29, 75, 116). In some other cases, the value 'P' may be selected as half of the number of polar channels whose indices are greater than the channel index of the polar channel for the first information bit and which are not selected as information bits. Additionally or alternatively, 'P' may be selected to be equal to or less than the number of polar channels whose indices are greater than the channel index of the polar channel for the first information bit and which are not selected as information bits. In some examples, the remaining polar channels not selected as parity check bits or information bits may be assigned as frozen bits.

Aspects of the disclosure are initially described in the context of a wireless communications system. Aspects of the disclosure are next described with reference to a device, channels, and reliability plots that support parity check bit assignments in a polar code. Aspects of the disclosure are further illustrated by and described with reference to a process flow, apparatus diagrams, system diagrams, and flowcharts that relate to parity bit channel assignment for polar coding.

FIG. 1 illustrates an example of a wireless communications system 100 in accordance with various aspects of the present disclosure. The wireless communications system 100 includes base stations 105, UEs 115, and a core network 130. In some examples, the wireless communications system 100 may be a Long Term Evolution (LTE), LTE-Advanced (LTE-A) network, or a New Radio (NR) network. In some cases, wireless communications system 100 may support enhanced broadband communications, ultra-reliable (i.e., mission critical) communications, low latency communications, and communications with low-cost and low-complexity devices. A UE 115 or a base station 105 may support polar coding and may therefore implement an encoder for encoding bits prior to obtain a codeword for transmission. The codeword may be received at a receiving device (e.g., a UE 115 or a base station 105), and may be decoded using a decoder. The techniques for encoding and decoding may involve assigning information bits to polar channels of an encoder or decoder and then assigning parity check bits to other polar channels of the encoder or decoder based on the assignment of the information bits. For example, an encoder may assign one or more parity check bits to polar channels having a channel index greater than the assigned channel index for the first information bit.

Base stations 105 may wirelessly communicate with UEs 115 via one or more base station antennas. Each base station 105 may provide communication coverage for a respective geographic coverage area 110. Communication links 125 shown in wireless communications system 100 may include uplink transmissions from a UE 115 to a base station 105, or downlink transmissions, from a base station 105 to a UE 115. Control information and data may be multiplexed on an uplink channel or downlink according to various techniques. Control information and data may be multiplexed on a downlink channel, for example, using time division multiplexing (TDM) techniques, frequency division multiplexing (FDM) techniques, or hybrid TDM-FDM techniques. In some examples, the control information transmitted during a transmission time interval (TTI) of a downlink channel may be distributed between different control regions in a cascaded manner (e.g., between a common control region and one or more UE-specific control regions).

UEs 115 may be dispersed throughout the wireless communications system 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may also be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of Things (IoT) device, an Internet of Everything (IoE) device, a machine type communication (MTC) device, an appliance, an automobile, or the like.

In some cases, a UE 115 may also be able to communicate directly with other UEs (e.g., using a peer-to-peer (P2P) or device-to-device (D2D) protocol). One or more of a group of UEs 115 utilizing D2D communications may be within the geographic coverage area 110 of a cell. Other UEs 115 in such a group may be outside the geographic coverage area 110 of a cell, or otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out independent of a base station 105.

Some UEs 115, such as MTC or IoT devices, may be low cost or low complexity devices, and may provide for automated communication between machines, i.e., Machine-to-Machine (M2M) communication. M2M or MTC may refer to data communication technologies that allow devices to communicate with one another or a base station without human intervention. For example, M2M or MTC may refer to communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

In some cases, an MTC device may operate using half-duplex (one-way) communications at a reduced peak rate. MTC devices may also be configured to enter a power saving "deep sleep" mode when not engaging in active communications. In some cases, MTC or IoT devices may be designed to support mission critical functions and wireless communications system may be configured to provide ultra-reliable communications for these functions.

Base stations 105 may communicate with the core network 130 and with one another. For example, base stations 105 may interface with the core network 130 through backhaul links 132 (e.g., S1, etc.). Base stations 105 may communicate with one another over backhaul links 134 (e.g., X2, etc.) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as evolved NodeBs (eNBs) 105.

A base station 105 may be connected by an S1 interface to the core network 130. The core network may be an evolved packet core (EPC), which may include at least one mobility management entity (MME), at least one serving gateway (S-GW), and at least one Packet Data Network (PDN) gateway (P-GW). The MME may be the control node that processes the signaling between the UE 115 and the EPC. All user Internet Protocol (IP) packets may be transferred through the S-GW, which itself may be connected to the P-GW. The P-GW may provide IP address allocation as well as other functions. The P-GW may be connected to the network operators IP services. The operators IP services may include the Internet, the Intranet, an IP Multimedia Subsystem (IMS), and a Packet-Switched (PS) Streaming Service.

The core network 130 may provide user authentication, access authorization, tracking, Internet Protocol (IP) connectivity, and other access, routing, or mobility functions. At least some of the network devices, such as base station 105 may include subcomponents such as an access network entity, which may be an example of an access node controller (ANC). Each access network entity may communicate with a number of UEs 115 through a number of other access network transmission entities, each of which may be an example of a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate in an ultra-high frequency (UHF) frequency region using frequency bands from 700 MHz to 2600 MHz (2.6 GHz), although some networks (e.g., a wireless local area network (WLAN)) may use frequencies as high as 4 GHz. This region may also be known as the decimeter band, since the wavelengths range from approximately one decimeter to one meter in length. UHF waves may propagate mainly by line of sight, and may be blocked by buildings and environmental features. However, the waves may penetrate walls sufficiently to provide service to UEs 115 located indoors. Transmission of UHF waves is characterized by smaller antennas and shorter range (e.g., less than 100 km) compared to transmission using the smaller frequencies (and longer waves) of the high frequency (HF) or very high frequency (VHF) portion of the spectrum. In some cases, wireless communications system 100 may also utilize extremely high frequency (EHF) portions of the spectrum (e.g., from 30 GHz to 300 GHz). This region may also be known as the millimeter band, since the wavelengths range from approximately one millimeter to one centimeter in length. Thus, EHF antennas may be even smaller and more closely spaced than UHF antennas. In some cases, this may facilitate use of antenna arrays within a UE 115 (e.g., for directional beamforming). However, EFT transmissions may be subject to even greater atmospheric attenuation and shorter range than UHF transmissions.

Thus, wireless communications system 100 may support millimeter wave (mmW) communications between UEs 115 and base stations 105. Devices operating in mmW or EHF bands may have multiple antennas to allow beamforming. That is, a base station 105 may use multiple antennas or antenna arrays to conduct beamforming operations for directional communications with a UE 115. Beamforming (which may also be referred to as spatial filtering or directional transmission) is a signal processing technique that may be used at a transmitter (e.g., a base station 115) to shape and/or steer an overall antenna beam in the direction of a target receiver (e.g., a UE 115). This may be achieved by combining elements in an antenna array in such a way that transmitted signals at particular angles experience constructive interference while others experience destructive interference.

Multiple-input multiple-output (MIMO) wireless systems use a transmission scheme between a transmitter (e.g., a base station 105) and a receiver (e.g., a UE 115), where both transmitter and receiver are equipped with multiple antennas. Some portions of wireless communications system 100 may use beamforming. For example, base station 105 may have an antenna array with a number of rows and columns of antenna ports that the base station 105 may use for beamforming in its communication with UE 115. Signals may be transmitted multiple times in different directions (e.g., each transmission may be beamformed differently). A mmW receiver (e.g., a UE 115) may try multiple beams (e.g., antenna subarrays) while receiving the synchronization signals.

In some cases, the antennas of a base station 105 or UE 115 may be located within one or more antenna arrays, which may support beamforming or MIMO operation. One or more base station antennas or antenna arrays may be collocated at an antenna assembly, such as an antenna tower. In some cases, antennas or antenna arrays associated with a base station 105 may be located in diverse geographic locations. A base station 105 may multiple use antennas or antenna arrays to conduct beamforming operations for directional communications with a UE 115.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use Hybrid ARQ (HARQ) to provide retransmission at the MAC layer to improve link efficiency. In the control plane, the Radio Resource Control (RRC) protocol layer may provide establishment, configuration, and maintenance of an RRC connection between a UE 115 and a network device or core network 130 supporting radio bearers for user plane data. At the Physical (PHY) layer, transport channels may be mapped to physical channels.

A shared radio frequency spectrum band may be utilized in an NR shared spectrum system. For example, an NR shared spectrum may utilize any combination of licensed, shared, and unlicensed spectrums, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across frequency) and horizontal (e.g., across time) sharing of resources.

In some cases, wireless communications system 100 may utilize both licensed and unlicensed radio frequency spectrum bands. For example, wireless communications system 100 may employ LTE License Assisted Access (LTE-LAA) or LTE Unlicensed (LTE U) radio access technology or NR technology in an unlicensed band such as the 5 Ghz Industrial, Scientific, and Medical (ISM) band. When operating in unlicensed radio frequency spectrum bands, wireless devices such as base stations 105 and UEs 115 may employ listen-before-talk (LBT) procedures to ensure the channel is clear before transmitting data. In some cases, operations in unlicensed bands may be based on a CA configuration in conjunction with CCs operating in a licensed band. Operations in unlicensed spectrum may include downlink transmissions, uplink transmissions, or both. Duplexing in unlicensed spectrum may be based on frequency division duplexing (FDD), time division duplexing (TDD) or a combination of both.

Figure 2:
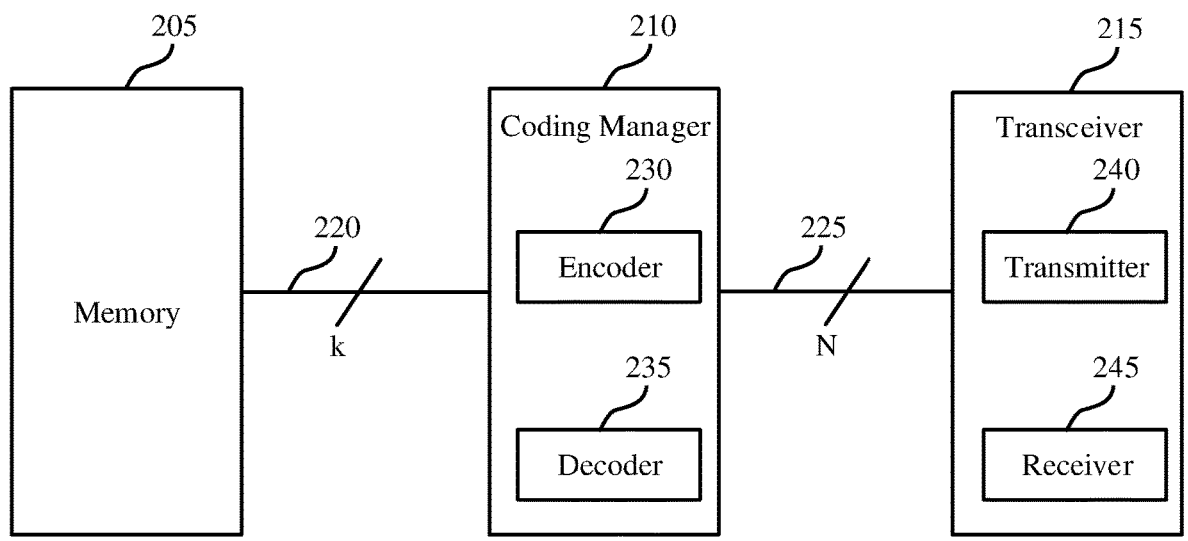
FIG. 2 illustrates an example of a wireless device that supports parity bit channel assignment for polar coding in accordance with aspects of the present disclosure.

FIG. 2 illustrates an example of a device 200 that supports parity bit channel assignment for polar coding in accordance with various aspects of the present disclosure. The device 200 may be any device within a wireless communications system 100 that performs an encoding or decoding process. The device 200 may be, for example, a UE 115 or base station 105 as described in FIG. 1.

As shown, device 200 includes a memory 205, a coding manager 210, and a transceiver 215. Bus 220 may connect memory 205 to coding manager 210 and bus 225 may connect coding manager 210 to transceiver 215. Coding manager 210 may include or implement an encoder 230 and a decoder 235. Transceiver 215 may include or implement a transmitter 240 and a receiver 245. In some instances, device 200 may have data stored in memory 205 to be transmitted to another device, such as a UE 115 or base station 105.

To initiate the transmission process, the device 200 may retrieve data (e.g., in the form of an input vector) from memory 205 for transmission. The data may include a number of information bits and may be provided from memory 205 to coding manager 210 via bus 220. The number of information bits may be represented as a value 'k,' as shown. The encoder 230 may encode the number of information bits and output a codeword having a length 'N,' which may be different than or the same as k. The bits that are not allocated as information bits (i.e., N-k bits) may be assigned as frozen bits or parity bits. Parity bits may be used in parity check polar coding techniques and frozen bits may be bits of a value (0, 1, etc.) known to both the encoder 230 and decoder 235 (i.e., the encoder encoding information bits at a transmitter 240 and the decoder 235 decoding the codeword received at a receiver). In some cases, bits designated as parity check bits may not be used to store information or may be dynamic frozen bits such that a bit selected as a parity check bit may be reassigned as a frozen bit. From the receiving device perspective, device 200 may receive encoded data via receiver 245, and decode the encoded data using decoder 235 to obtain the transmitted data.

Encoder 230 may use a number of encoding techniques to encode the data for transmission which may introduce redundancy into the encoded output. For example, error correcting codes may be used to introduce redundancy in a code block so that transmission errors may be detected and corrected. Example encoding techniques include linear block encoding, polar encoding, Reed-Muller (RM) encoding, polar RM encoding, and the like. This redundancy may increase the overall probability that the number of information bits will be successfully decoded upon reception. In some examples, the method for encoding data transmissions by the encoder 230 may involve generating compact polar codes, RM codes, polar RM codes, or other Plotkin codes of length 'N' and dimension 'k'.

In some cases, location of parity check bits may be determined based on a generator weight 'w'. In some cases, the generator weight 'w' may correspond to the weight of the number of information bits (e.g., the number of '1s' or 'k'). The weight distribution of a codeword to be transmitted may be optimized by the inclusion of parity check bits, and may facilitate the decoding performance. Additionally or alternatively, the use of parity check bits may allow for earlier pruning of a selected candidate path, which may improve decoding performance. Unlike CRC bits, which may be used for CRC aided successive cancellation list (CA-SCL) decoding, parity check bits may not be considered overhead. For instance, in some cases, parity check bits may be decoded by decoder 235 during decoding of information bits or other bits (e.g., frozen bits), whereas a CRC bit may add additional bits to be decoded. Depending on the type of parity check bit (i.e., if it has or has not been reassigned as a frozen bit), the parity check bit may be compared to '0' if it is a frozen bit, or it may be compared to an information bit (e.g., 1). Thus, from a decoding perspective, a parity check bit may not be considered overhead as it may be implemented without adding to the number of bits to be decoded. Additionally, in some cases, the number of parity check bits may play a role in the performance of CA-SCL decoding. For example, the larger the number of parity check bits, the more robust the CA-SCL decoding performance.

In some cases, parity check polar codes may be constructed by assigning a subset polar channels of an encoder 230 or decoder 235 for parity check bits. In some cases, a polar channel from the subset of polar channels may correspond to a single bit, such as a frozen, information, or parity check bit. In some cases, reliability metrics for the various polar channels may be calculated based. For example, the probability that a given polar channel will be successfully decoded may be referred to as reliability. In some cases, the polar channels assigned to parity check bits may be more reliable than one or more polar channels assigned to information bits. In some cases, the row weight of a generator matrix may be used for assigning polar channels to parity check bits and there may be no limit on the number of polar channels that may be selected for parity check bits. In such cases, the ability to apply fast parallel decoding techniques may be adversely impacted (e.g., due to power and computation constraints).

According to various aspects, a multi-step process may involve sorting the polar channels according to respective reliabilities, selecting the most reliable polar channels for information bits, and assigning parity check bits based on a channel index associated with one or more information bits. The encoder 230 may encode the number of information bits and output a codeword having a length 'N', which may be different than or the same as k. Furthermore, the bits not selected as information bits (i.e., 'N-k' bits) may be assigned as parity bits and/or frozen bits. In some cases, a subset of the 'N' bits may be removed or deleted following encoding. This technique may be referred to as puncturing, and the subset of the 'N' bits removed following encoding may be referred to as punctured bits. In some cases, the sum of the number of bits selected as information bits and frozen and/or parity check bits may be represented as a value 'M', and the number of punctured bits may be represented by 'N-M'.

In some cases, the plurality of polar channels may be sorted according to the reliability of each polar channel, and the least reliable 'N-M' polar channels may be selected for 'N-M' puncture bits, Excluding the puncture bits, the 'K' most reliable polar channels may be selected for information bits together with corresponding CRC bits. Thus, the number of bits remaining for frozen and/or parity check bits is 'M-k'. According to some examples, from the remaining 'M-k' polar channels, the encoder 230 may select one or more polar channels (e.g., a value 'P') whose indices are greater than the channel index of the polar channel for the first information bit. Further, the encoder 230 may select the 'P' polar channels for parity check bits. In some cases, the number of parity check bits 'P' may be selected as a constant value (e.g., 8). In some other cases, the value 'P' may selected as half of the number of polar channels whose indices are greater than the channel index of the polar channel for the first information bit, and not selected as information bits. Additionally or alternatively, 'P' may be selected to be equal to or less than the number of polar channels whose indices are greater than the channel index of the polar channel for the first information bit, and not selected as information bits. As previously discussed, while a larger value for 'P' improves the decoding performance, it may add to the computation costs and complexity of the decoding operation.

In some examples, the remaining polar channels (i.e., M-k-P) may be assigned as frozen bits. During decoding, the parity check bit may be compared with a previously decoded information bit. In some cases, the parity check bit may match the previously decoded information bit. In some other cases, the parity check bit may not match the previously decoded information bit, prompting the receiving or decoding device to add a penalty or error. In some cases, the penalty or error added to correct the codeword may be based in part on the error estimated between the decoded value (i.e., 0 or another value) of a frozen bit with the ideal value of a frozen bit (i.e., 0).

Figure 3:
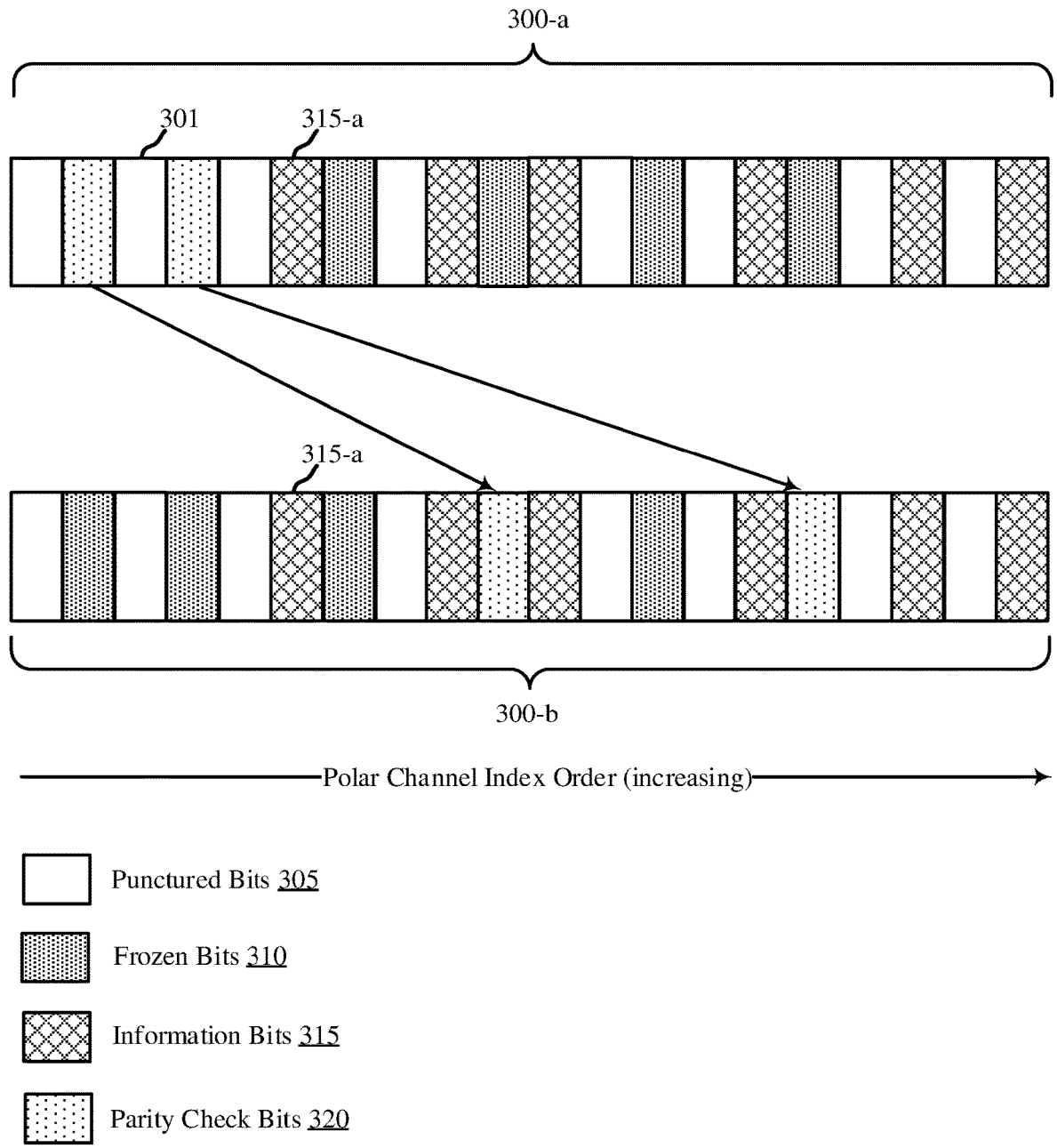
FIG. 3 illustrates example polar channels that support parity bit channel assignment for polar coding in accordance with aspects of the present disclosure.

FIG. 3 illustrates an example of polar channel sets 300-a and 300-b that support parity bit channel assignment for polar coding in accordance with various aspects of the present disclosure. Each polar channel set 300-a, 300-b includes multiple polar channels 301. In some cases, each of the polar channels 301 may be assigned as a punctured bit 305, frozen bit 310, information bit 315, or parity check bit 320 for the purpose of polar coding. Encoding the polar channels 301 may be performed by any device or a component of the device within a wireless communications system 100 that performs an encoding or decoding process, for example, a UE 115 or base station 105, or an encoder 230 or decoder 235 as described in FIGS. 1 and 2.

The polar channels 301 may be indexed sequentially by frequency such that consecutive channel indices correspond to adjacent polar channels in the frequency domain. Each channel index may have a corresponding reliability metric. As previously described, the information bits 315 may be assigned to the most reliable polar channels 301 in a polar channel set 300, and the frozen bits 310, punctured bits 305, and/or parity check bits 320 may be assigned to the remaining polar channels 301.

As illustrated in polar channel set 300, an encoder may encode a set of 'k' information bits 315 (e.g., 6) in a codeword of length 'N' (e.g., 20). In some cases, the encoder may encode the information bits 315 at the 'k' most reliable channel indices to obtain a codeword for transmission. A decoder may decode the codeword to obtain the information bits 315, but may refrain from decoding the bits (frozen and/or parity) with channel indices lower than the channel index for the first information bit 315-a. Instead, the decoder may identify the first information bit 315-a, and may determine that the start of the decoding path includes, for example, 5 frozen bits 310 (e.g., the codeword may begin with 5 consecutive 0 bits before the first information bit 315-a). Based on this determination, the decoder may refrain from performing the computations to determine the first 5 bits, which as illustrated in polar channel set 300-a, may include one or more parity check bits 320. As described above, parity check bits 320 may be used for error correction, for example, by corresponding to a previously decoded information bit. Thus, skipping decoding of a parity check bit 320 may adversely affect error correcting and decoding performance.

According to some aspects, an encoder may shift the parity check bits 320 to channel indices greater than the channel index of the first information bit 315 to optimize decoding performance. For example, as illustrated in polar channel set 300-b, an encoder may transmit a set of 'k' information bits 315 (e.g., 6) in a codeword of length 'N' (e.g., 20), in which the information bit 315 with the lowest index is indicated as information bit 315-a. In some cases, the encoder may encode the information bits 315 at the 'k' most reliable channel indices. According to some aspects, an encoder may select one or more polar channels (e.g., a value 'P') having channel indices greater than the channel index of the polar channel for the first information bit 315-b. Further, the encoder may select the 'P' polar channels for parity check bits 320. In some cases, the number of parity check bits 'P' may be selected as a constant value (e.g., 2). In some other cases, the value 'P' may selected as half of the number of polar channels whose indices are greater than the channel index of the polar channel for the first information bit 315-a, and not selected as information bits 315. Additionally, in some cases, 'P' may be selected to be equal to or less than the number of polar channels 301 whose indices are greater than the channel index of the polar channel 301 for the first information bit 315-a, and not selected as information bits 315. Thus, as shown in polar channel set 300-b, parity check bits 320 have been assigned to channels having indices greater than the channel index associated with the first information bit 315-a.

Figure 4:
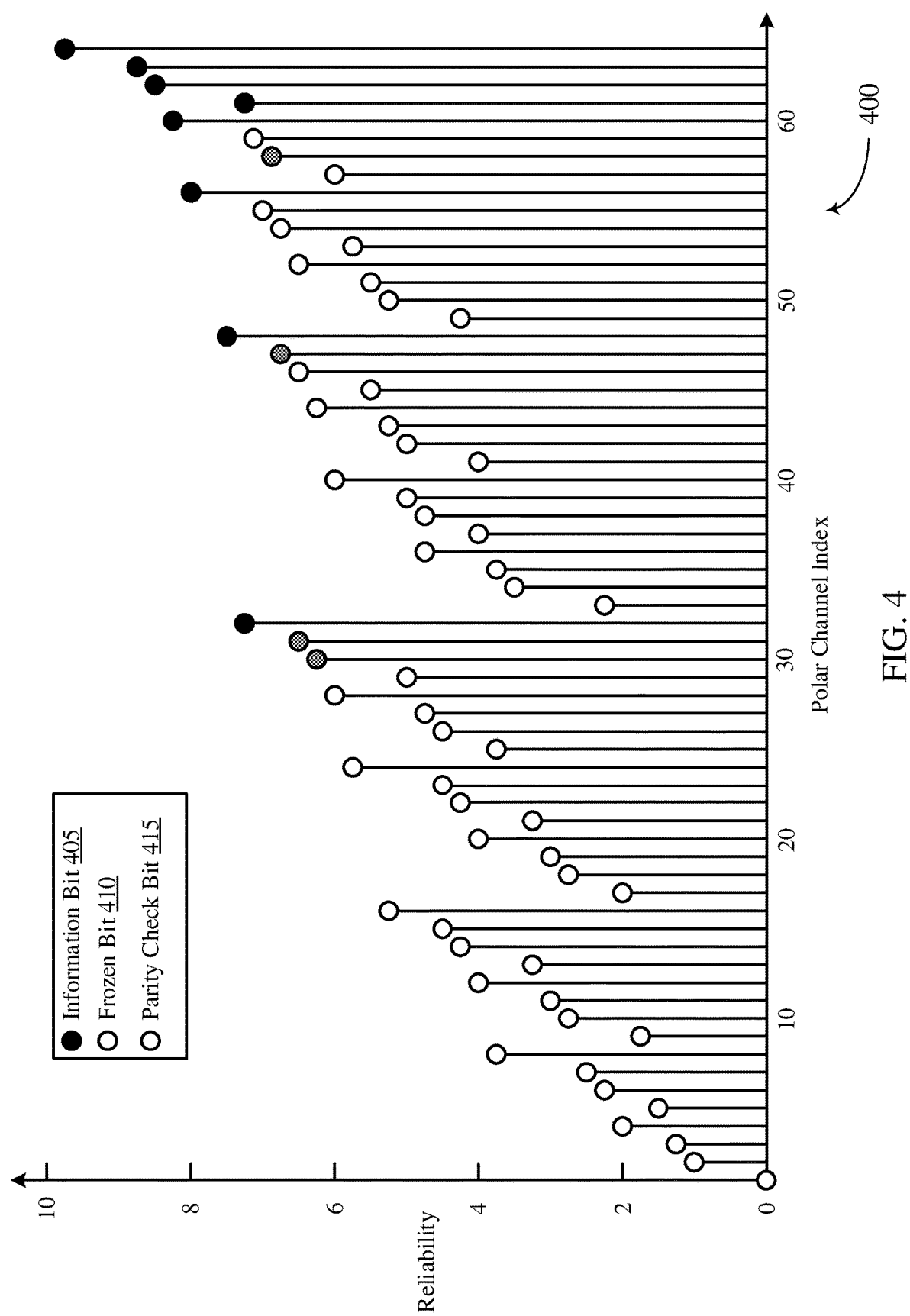
FIG. 4 illustrates an example of a polar channel reliability plot that supports parity bit channel assignment for polar coding in accordance with aspects of the present disclosure.

FIG. 4 illustrates an example of a polar channel reliability plot 400 that supports parity bit channel assignment for polar coding in accordance with various aspects of the present disclosure. Polar channel reliability plot 400 shows a polar channel reliability (e.g., on a scale from 0 to 10), which may be referred to as a reliability metric, for each channel index within a 64 bit codeword. Other reliability values and codeword lengths may be considered without departing from the scope of the present disclosure.

As illustrated in polar channel reliability plot 400, an encoder may transmit a set of 8 information bits 405 in a codeword of 64 bits. In this case, the decoder may receive 8 information bits 405, 4 parity check bits 415, and 52 frozen bits 410 over 64 polar channels, each associated with respective channel indices. In some cases, the encoder may encode the 8 information bits 405 at the 8 most reliable channel indices channel indices 32, 48, 56, 60, 61, 62, 63, and 64). A decoder may decode the information bits 405 within the codeword, but may refrain from decoding the frozen bits 410 and parity check bits 415 with channel indices lower than the channel index for the first information bit 405 (e.g., the information bit 405 at channel index 32). Instead, the decoder may identify the first information bit 405, and may determine that the start of the decoding path must be 31 frozen bit 410 default values (e.g., the codeword may begin with 31 consecutive 0 bits before the first information bit 405). Based on this determination, the decoder may refrain from performing the computations to decode the two parity check bits 415 (e.g., at channel indices 21 and 26) that have channel indices lower than the channel index of the first information bit 405. In some cases, this may adversely affect the decoding reliability and performance for the codeword. Alternatively, the decoder may begin decoding at channel index 30, in order to determine the parity check bits 415 prior to the first information bit 405 at channel index 32. This decoding process may result in increased latency due to the additional computations performed to decode the parity check bits prior to the first information bit 405.

Figure 5:
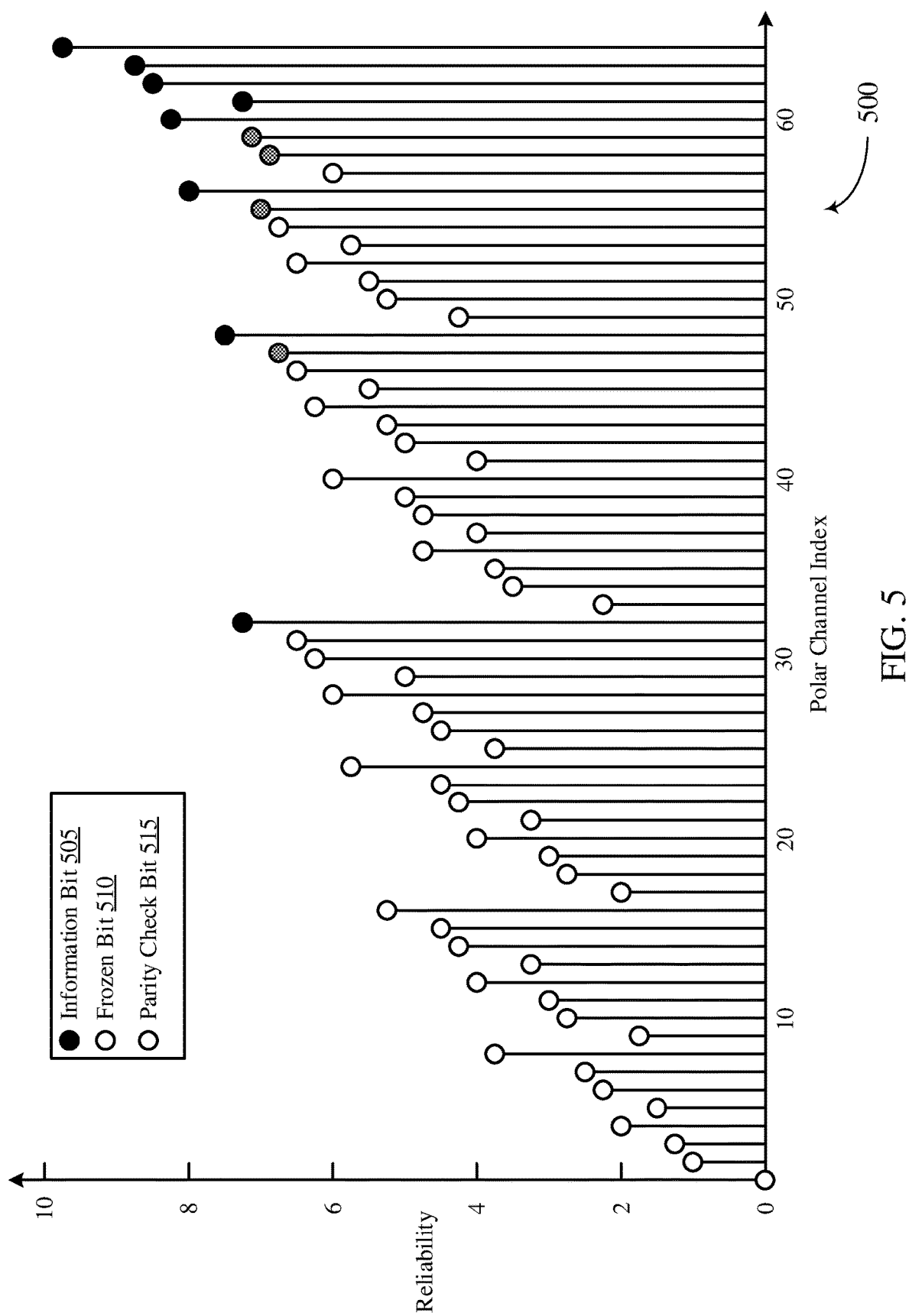
FIG. 5 illustrates an example of a polar channel reliability plot that supports parity bit channel assignment for polar coding in accordance with aspects of the present disclosure.

FIG. 5 illustrates an example of a polar channel reliability plot 500 that supports parity bit channel assignment for polar coding in accordance with various aspects of the present disclosure. Polar channel reliability plot 500 shows a polar channel reliability (e.g., on a scale from 0 to 10), which may be referred to as a reliability metric, for each channel index within a 64 bit codeword. Other reliability values and codeword lengths may be considered without departing from the scope of the present disclosure.

Polar channel reliability plot 500 illustrates a polar coding technique optimizing decoding performance, as the information bits 505 are assigned to the most reliable channels, and the parity check bits 515 are assigned to the most reliable polar channels that have a channel index greater than the channel index for the first information bit 505 and which are not assigned as information bits 505. Lastly, the frozen bits 510 are assigned to the rest of the polar channels. As compared to the polar channel reliability plot 400 illustrated in FIG. 4, the parity check bits with indices lower than the first information bit 505 have been shifted to channel indices greater than the first information bit 505.

As illustrated in polar channel reliability plot 500, an encoder may transmit a set of 8 information bits 505 in a codeword of 64 bits. In this case, the decoder may receive 8 information bits 505, 4 parity check bits 515, and 52 frozen bits 510 over 64 polar channels, each associated with respective channel indices. In some cases, the encoder may encode the 8 information bits 505 at the 8 most reliable channel indices (e.g., channel indices 32, 48, 56, 60, 61, 62, 63, and 64), and the parity check at the 4 most reliable channel indices that are greater than the channel index of the first information bit 505 (e.g., 32 in this case). A decoder may decode the information bits 505 within the codeword, but may refrain from decoding the frozen bits 410 with channel indices lower than the channel index for the first information bit 505. Instead, the decoder may identify the first information bit 505, and may determine that the start of the decoding path must be 31 frozen bit 510 default values (e.g., the codeword may begin with 31 consecutive 0 bits before the first information bit 505). Thus, all 4 of the parity check bits 515 with channel indices greater than 32 may be decoded under the current polar coding technique, optimizing decoding performance without increasing latency.

Figure 6:
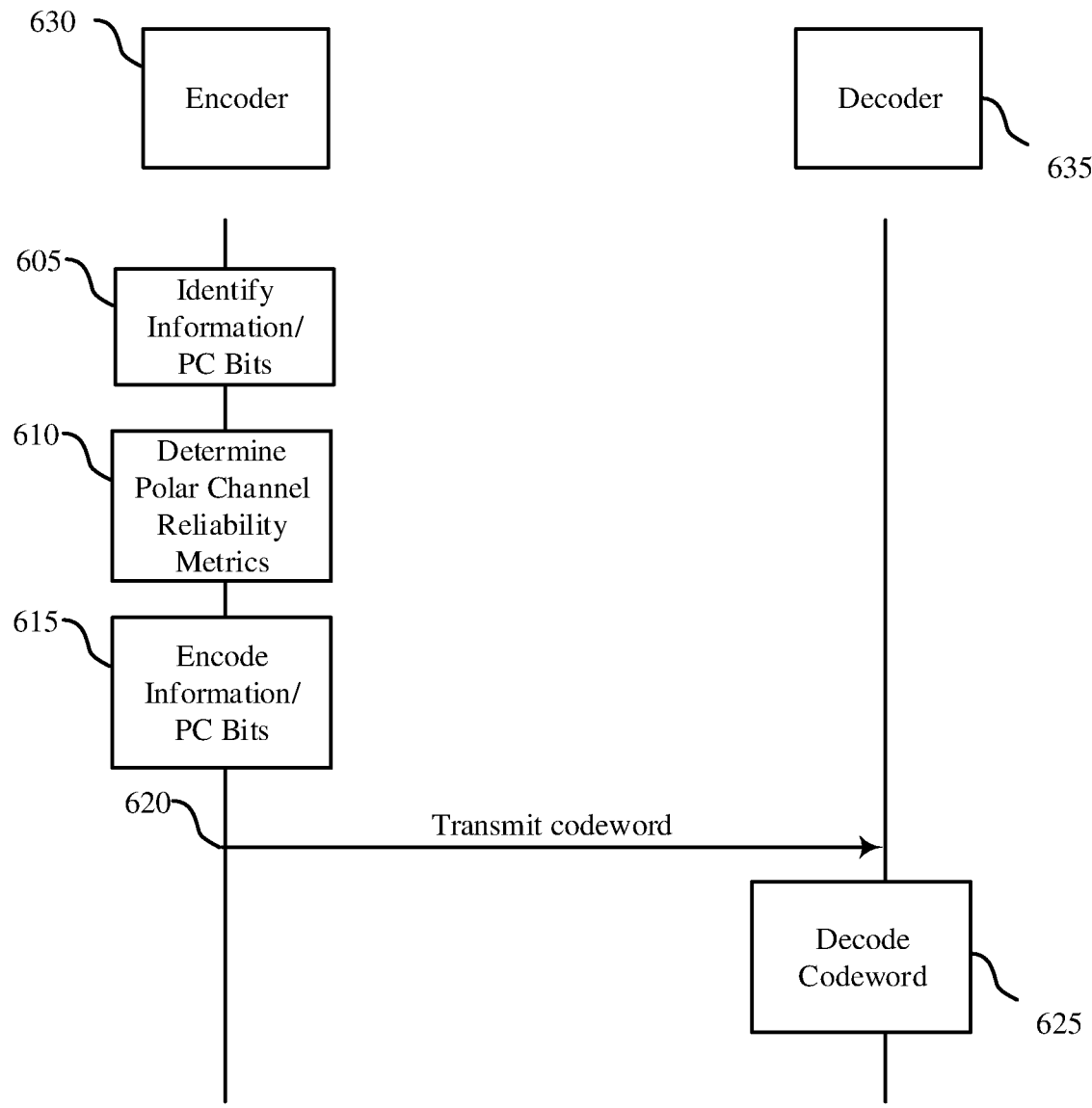
FIG. 6 illustrates an example of a process flow that supports parity bit channel assignment for polar coding in accordance with aspects of the present disclosure.

FIG. 6 illustrates an example of a process flow 600 that supports parity bit channel assignment for polar coding in accordance with various aspects of the present disclosure. The process illustrated by process flow 600 may be implemented by any device (not shown) or component of the device within a wireless communications system that performs an encoding or decoding process. The device may be, for example, a UE 115 or base station 105 as described in FIG. 1. In some cases, the component of the device may include, for example, an encoder 630 or decoder 635, which may be examples of the encoder 230 and decoder 235, as described with reference to FIG. 2.

At 605, the encoder 630 may identify a set of 'k' information bits and 'P' parity check bits for encoding using polar coding techniques.

At 610, the encoder 630 may determine respective reliability metrics for a set of 'N' polar channels of the encoder, wherein 'N' may be greater than or equal to 'k'. In some cases, the encoder 630 may determine from the set of polar channels a first polar channel for a first information bit based at least in part on the reliability metrics for the polar channels. Further, in some cases, the encoder 630 may determine a second polar channel that is separate from the first polar channel identified for the first information bit, for a first parity check bit. In some cases, the polar channel identified for the first parity check bit may have a channel index greater than the channel index for the first polar channel associated with the first information bit. In other cases, the encoder may access a table or database of reliability metric values associated with various and 'k' values.

At 615, the encoder 630 may iterate through each polar channel of the set of polar channels, and assign one of, an information bit, a parity check bit, or a frozen bit based on a polar channel reliability metric. For example, in some cases, the encoder may identify the 'k' most reliable polar channels for the 'k' information bits. Furthermore, in some cases, the encoder 630 may identify the 'P' most reliable polar channels that are not associated with information bits and have indices greater than the first polar channel for the first information bit, for parity check bits. In some cases, the number of the set of parity check bits ('P') may correspond to half of a number of channels having respective channel indices greater than the channel index of the first polar channel. In some other cases, 'P' may be selected such that it is less than or equal to a number of channels having respective channel indices greater than the channel index of the first polar channel. Following encoding the set of channels with one of an information bit or a parity check bit, the encoder may proceed to encode the remainder of the channels assigned as frozen bits to obtain a codeword.

At 620, the encoder 630 or a transmitter of the wireless device that includes the encoder 630 may transmit the codeword to a receiving device. In some cases, the decoder 635 of the receiving device may proceed to decode the codeword that includes at least the first information bit and the first parity check bit at 625.

Figure 7:
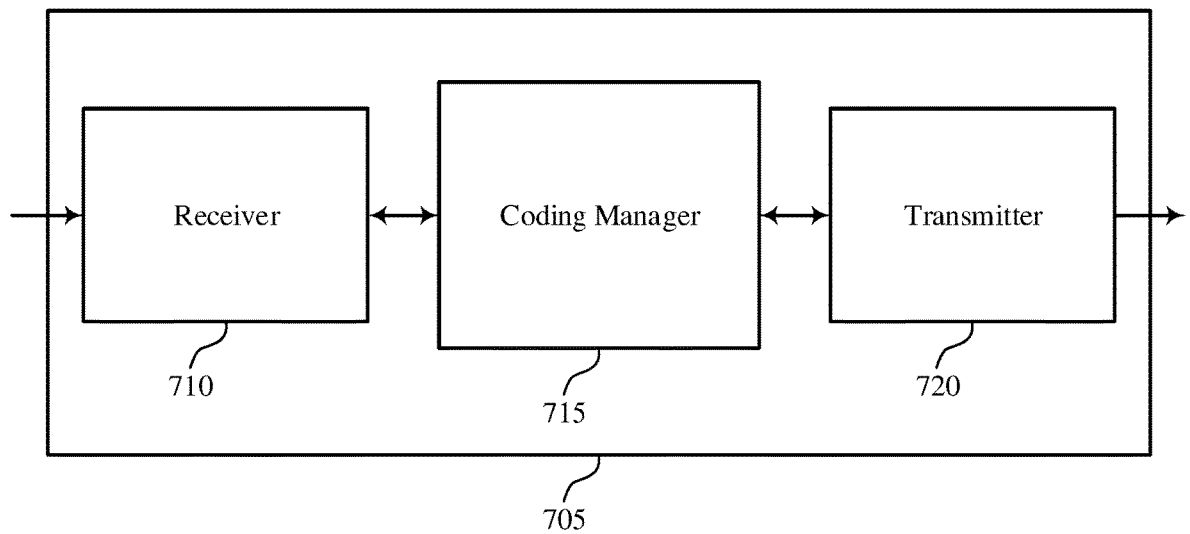
FIGS. 7 through 9 show block diagrams of a device that supports parity bit channel assignment for polar coding in accordance with aspects of the present disclosure.

FIG. 7 shows a block diagram 700 of a wireless device 705 that supports parity bit channel assignment for polar coding in accordance with aspects of the present disclosure. Wireless device 705 may be an example of aspects of a base station 105 or UE 115 as described with reference to FIG. 1. Wireless device 705 may include receiver 710, coding manager 715, and transmitter 720. Wireless device 705 may also include a processor. Each of these components may be in communication with one another (e.g., via one or more buses).

Receiver 710 may receive information such as packets, user data, or control information associated with various information channels (e.g., control channels, data channels, and information related to parity bit channel assignment for polar coding, etc.). Information may be passed on to other components of the device. The receiver 710 may utilize a single antenna or a set of antennas.

Coding manager 715 may be an example of aspects of the coding manager 915 described with reference to FIG. 9. Coding manager 715 and/or at least some of its various sub-components may be implemented in hardware, software executed by a processor, firmware, or any combination thereof. If implemented in software executed by a processor, the functions of the coding manager 715 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure.

The coding manager 715 and/or at least some of its various sub-components may be physically located at various positions, including being distributed such that portions of functions are implemented at different physical locations by one or more physical devices. In some examples, coding manager 715 and/or at least some of its various sub-components may be a separate and distinct component in accordance with various aspects of the present disclosure. In other examples, coding manager 715 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Coding manager 715 may identify a set of information bits and a set of parity check bits for encoding, determine, from a set of polar channels, a first polar channel for a first information bit of the set of information bits based on respective reliability metrics for the set of polar channels, determine, based on a channel index of the first polar channel, a second polar channel from the set of polar channels for a first parity check bit of the set of parity check bits, where a channel index of the second polar channel is greater than the channel index of the first polar channel, encode at least the first information bit and the first parity check bit based on the first polar channel and the second polar channel, and transmit a codeword including the encoded first information bit and the first parity check bit. The coding manager 715 may also receive a codeword including a set of information bits and a set of parity check bits, determine, from a set of polar channels, a first polar channel assigned to a first information bit of the set of information bits based on respective reliability metrics for the set of polar channels, determine, based on a channel index of the first polar channel, a second polar channel from the set of polar channels for a first parity check bit of the set of parity check bits, where a channel index of the second polar channel is greater than the channel index of the first polar channel, and decode at least the first information bit and the first parity check bit based on the first polar channel and the second polar channel.

Transmitter 720 may transmit signals generated by other components of the device. In some examples, the transmitter 720 may be collocated with a receiver 710 in a transceiver module. The transmitter 720 may utilize a single antenna or a set of antennas.

Figure 8:
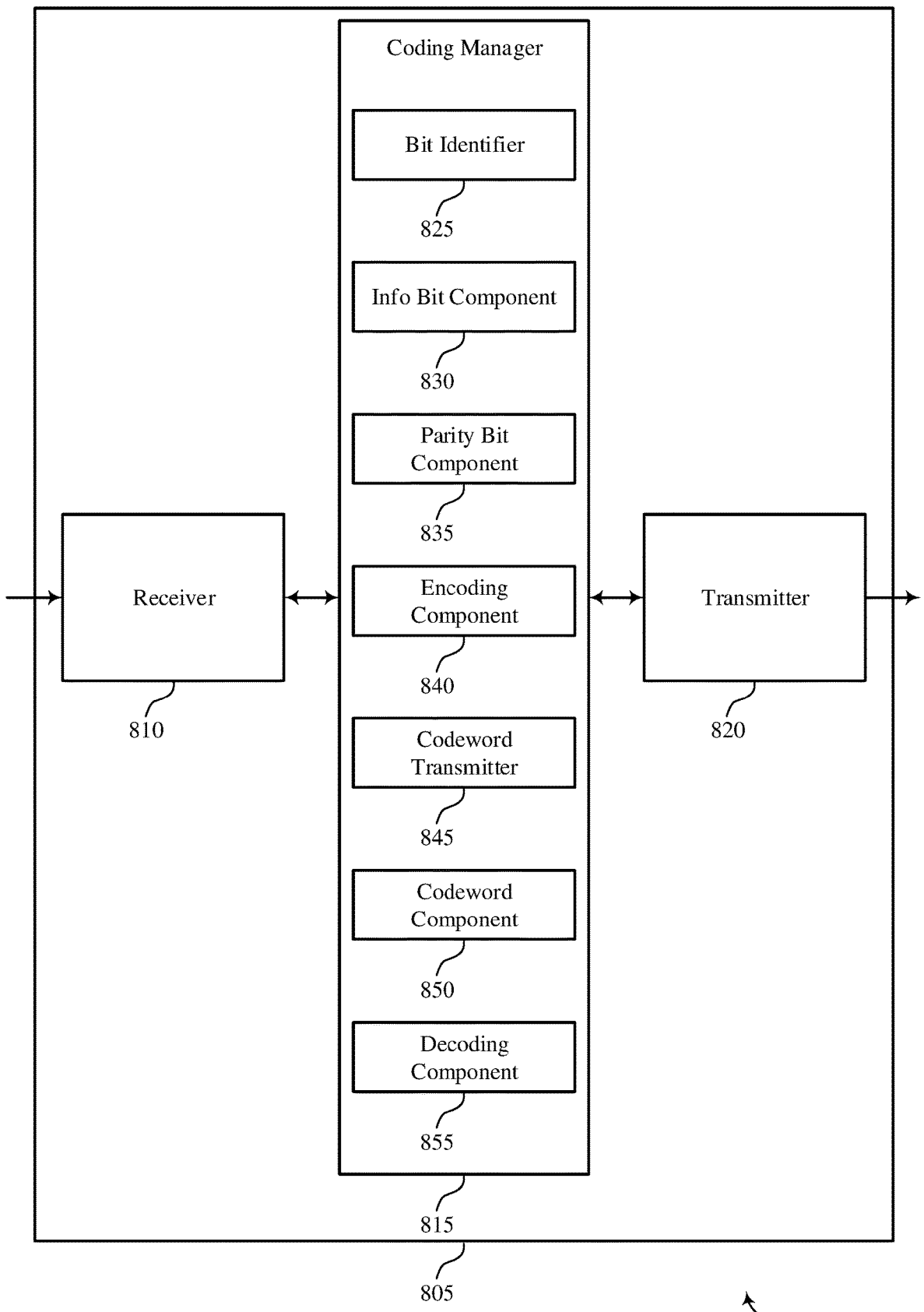

FIG. 8 shows a block diagram 800 of a wireless device 805 that supports parity bit channel assignment for polar coding in accordance with aspects of the present disclosure. Wireless device 805 may be an example of aspects of a wireless device 705 or a base station 105 or UE 115 as described with reference to FIGS. 1 and 7. Wireless device 805 may include receiver 810, coding manager 815, and transmitter 820. Wireless device 805 may also include a processor. Each of these components may be in communication with one another (e.g., via one or more buses).

Receiver 810 may receive information such as packets, user data, or control information associated with various information channels (e.g., control channels, data channels, and information related to parity bit channel assignment for polar coding, etc.). Information may be passed on to other components of the device. The receiver 810 may utilize a single antenna or a set of antennas.

Coding manager 815 may be an example of aspects of the coding manager 915 described with reference to FIG. 9.

Coding manager 815 may also include bit identifier 825, info bit component 830, parity bit component 835, encoding component 840, codeword transmitter 845, codeword component 850, and decoding component 855.

Bit identifier 825 may identify a set of information bits and a set of parity check bits for encoding.

Info bit component 830 may determine, from a set of polar channels, a first polar channel for a first information bit of the set of information bits based on respective reliability metrics for the set of polar channels and determine, from a set of polar channels, a first polar channel assigned to a first information bit of the set of information bits based on respective reliability metrics for the set of polar channels.

Parity bit component 835 may determine, based on a channel index of the first polar channel, a second polar channel from the set of polar channels for a first parity check bit of the set of parity check bits, where a channel index of the second polar channel is greater than the channel index of the first polar channel. In some cases, a reliability metric associated with a third channel of the set of polar channels is greater than a reliability metric associated with the second polar channel. In some cases, the second polar channel is associated with a first reliability metric that is greater than a second reliability metric associated with at least one other channel of the subset of the set of polar channels. In some cases, a number of the set of parity check bits corresponds to half of a number of channels having respective channel indices greater than the channel index of the first polar channel. In some cases, a number of the set of parity check bits is less than or equal to a number of channels having respective channel indices greater than the channel index of the first polar channel. In some cases, a reliability metric associated with a third channel of the set of polar channels is greater than a reliability metric associated with the second polar channel. In some cases, determining the second polar channel includes: determining respective reliability metrics for a subset of the set of polar channels having respective channel indices greater than the channel index of the first polar channel and selecting the second polar channel from the subset of the set of polar channels based on the respective reliability metrics. In some cases, determining the second polar channel includes: determining respective reliability metrics for a subset of the set of polar channels having respective channel indices greater than the channel index of the first polar channel and selecting the second polar channel from the subset of the set of polar channels based on the respective reliability metrics. In some cases, the second polar channel is associated with a first reliability metric that is greater than a second reliability metric associated with at least one other channel of the subset of the set of polar channels. In some cases, a number of the set of parity check bits corresponds to half of a number of channels having respective channel indices greater than the channel index of the first polar channel. In some cases, a number of the set of parity check bits is less than or equal to a number of channels having respective channel indices greater than the channel index of the first polar channel.

Encoding component 840 may encode at least the first information bit and the first parity check bit based on the first polar channel and the second polar channel and encode each parity check bit based on the respective channels.

Codeword transmitter 845 may transmit a codeword including the encoded first information bit and the first parity check bit.

Codeword component 850 may receive a codeword including a set of information bits and a set of parity check bits.

Decoding component 855 may decode at least the first information bit and the first parity check bit based on the first polar channel and the second polar channel and decode each parity check bit based on the respective channels.

Transmitter 820 may transmit signals generated by other components of the device. In some examples, the transmitter 820 may be collocated with a receiver 810 in a transceiver module. The transmitter 820 may utilize a single antenna or a set of antennas.

Figure 9:
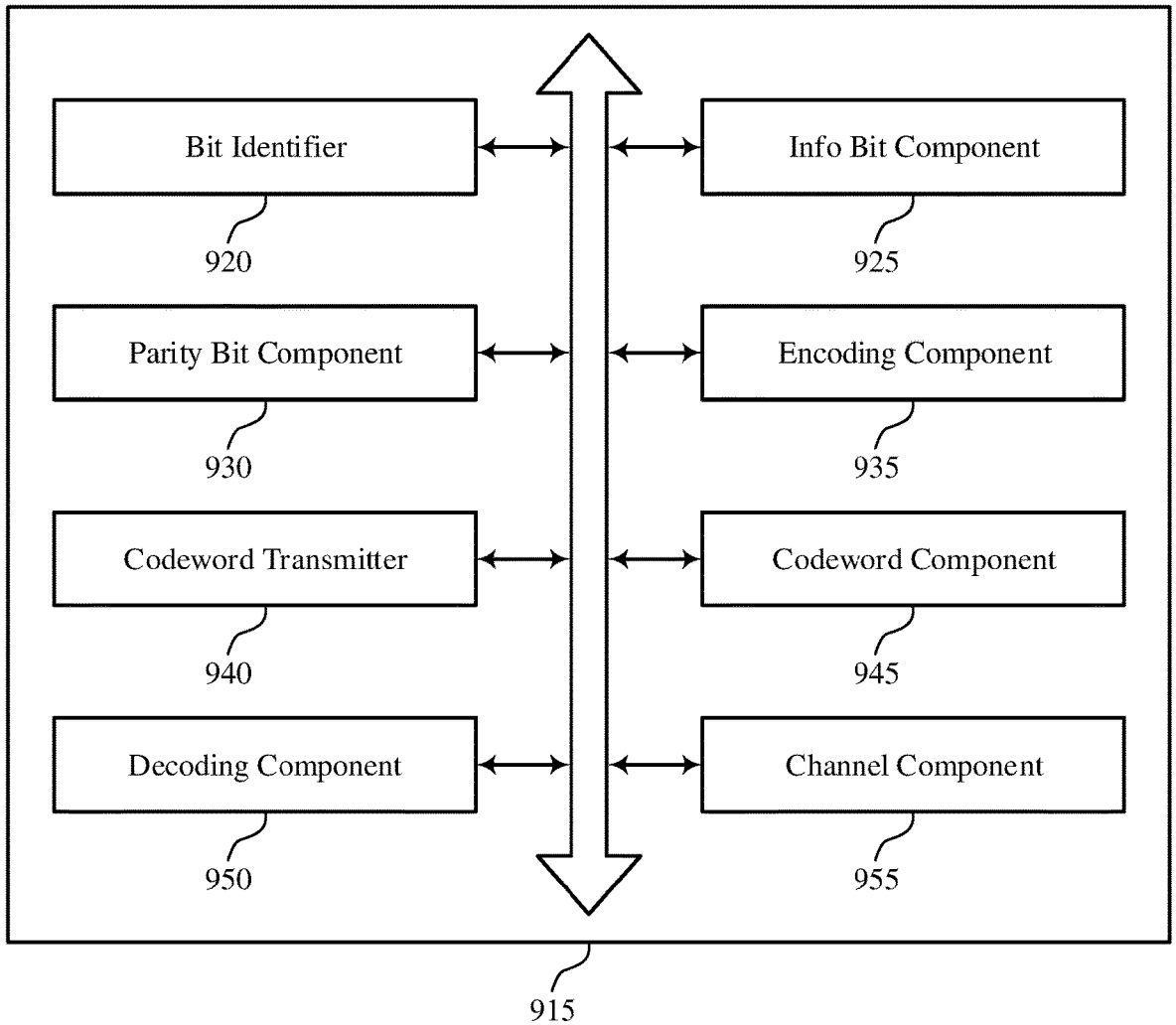

FIG. 9 shows a block diagram 900 of a coding manager 915 that supports parity bit channel assignment for polar coding in accordance with aspects of the present disclosure. The coding manager 915 may be an example of aspects of a coding manager 715, a coding manager 815, or a coding manager 915 described with reference to FIGS. 7, 8, and 9. The coding manager 915 may include bit identifier 920, info bit component 925, parity bit component 930, encoding component 935, codeword transmitter 940, codeword component 945, decoding component 950, and channel component 955. Each of these modules may communicate, directly or indirectly, with one another (e.g., via one or more buses).

Bit identifier 920 may identify a set of information bits and a set of parity check bits for encoding. Info bit component 925 may determine, from a set of polar channels, a first polar channel for a first information bit of the set of information bits based on respective reliability metrics for the set of polar channels and determine, from a set of polar channels, a first polar channel assigned to a first information bit of the set of information bits based on respective reliability metrics for the set of polar channels.

Parity bit component 930 may determine, based on a channel index of the first polar channel, a second polar channel from the set of polar channels for a first parity check bit of the set of parity check bits, where a channel index of the second polar channel is greater than the channel index of the first polar channel. In some cases, a reliability metric associated with a third channel of the set of polar channels is greater than a reliability metric associated with the second polar channel. In some cases, the second polar channel is associated with a first reliability metric that is greater than a second reliability metric associated with at least one other channel of the subset of the set of polar channels. In some cases, a number of the set of parity check bits corresponds to half of a number of channels having respective channel indices greater than the channel index of the first polar channel. In some cases, a number of the set of parity check bits is less than or equal to a number of channels having respective channel indices greater than the channel index of the first polar channel. In some cases, a reliability metric associated with a third channel of the set of polar channels is greater than a reliability metric associated with the second polar channel. In some cases, determining the second polar channel includes: determining respective reliability metrics for a subset of the set of polar channels having respective channel indices greater than the channel index of the first polar channel and selecting the second polar channel from the subset of the set of polar channels based on the respective reliability metrics. In some cases, determining the second polar channel includes: determining respective reliability metrics for a subset of the set of polar channels having respective channel indices greater than the channel index of the first polar channel and selecting the second polar channel from the subset of the set of polar channels based on the respective reliability metrics. In some cases, the second polar channel is associated with a first reliability metric that is greater than a second reliability metric associated with at least one other channel of the subset of the set of polar channels. In some cases, a number of the set of parity check bits corresponds to half of a number of channels having respective channel indices greater than the channel index of the first polar channel. In some cases, a number of the set of parity check bits is less than or equal to a number of channels having respective channel indices greater than the channel index of the first polar channel.

Encoding component 935 may encode at least the first information bit and the first parity check bit based on the first polar channel and the second polar channel and encode each parity check bit based on the respective channels. Codeword transmitter 940 may transmit a codeword including the encoded first information bit and the first parity check bit. Codeword component 945 may receive a codeword including a set of information bits and a set of parity check bits. Decoding component 950 may decode at least the first information bit and the first parity check bit based on the first polar channel and the second polar channel and decode each parity check bit based on the respective channels.

Channel component 955 may determine, based on the channel index of the first polar channel, respective channels of the set of polar channels for each parity check bit of the set of parity check bits. In some cases, each index of the respective channels is greater than the channel index of the first polar channel. In some cases, each index of the respective channels is greater than the channel index of the first polar channel.

Figure 10:
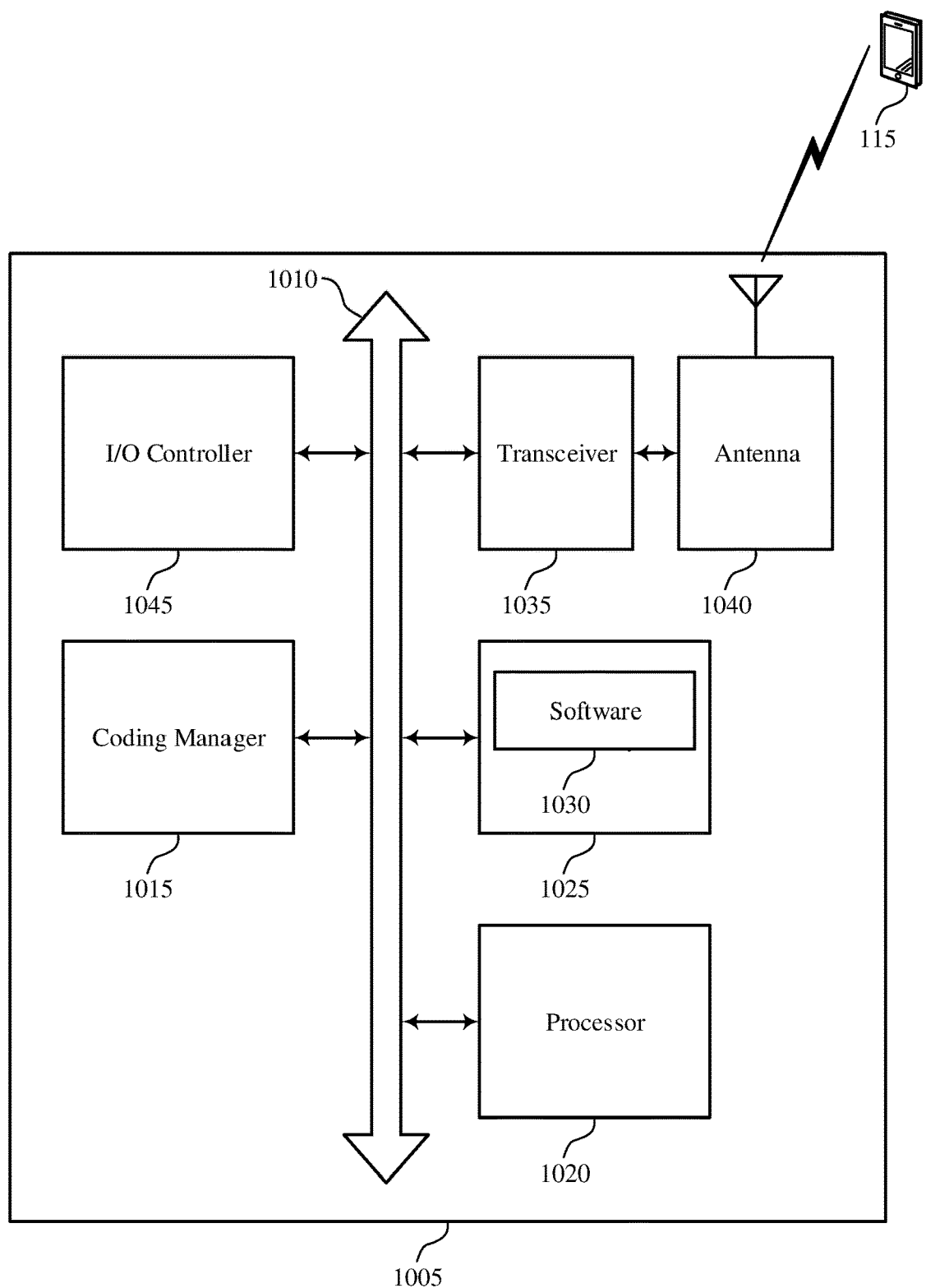
FIG. 10 illustrates a block diagram of a system including a wireless device that supports parity bit channel assignment for polar coding in accordance with aspects of the present disclosure.

FIG. 10 shows a diagram of a system 1000 including a device 1005 that supports parity bit channel assignment for polar coding in accordance with aspects of the present disclosure. Device 1005 may be an example of or include the components of wireless device 705, wireless device 805, or a base station 105 or UE 115 as described above, e.g., with reference to FIGS. 1, 7 and 8. Device 1005 may include components for bi-directional voice and data communications including components for transmitting and receiving communications, including coding manager 1015, processor 1020, memory 1025, software 1030, transceiver 1035, antenna 1040, and I/O controller 1045. These components may be in electronic communication via one or more busses (e.g., bus 1010).

Processor 1020 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1020 may be configured to operate a memory array using a memory controller. In other cases, a memory controller may be integrated into processor 1020. Processor 1020 may be configured to execute computer-readable instructions stored in a memory to perform various functions (e.g., functions or tasks supporting parity bit channel assignment for polar coding).

Memory 1025 may include random access memory (RAM) and read only memory (ROM). The memory 1025 may store computer-readable, computer-executable software 1030 including instructions that, when executed, cause the processor to perform various functions described herein. In some cases, the memory 1025 may contain, among other things, a basic input/output system (BIOS) which may control basic hardware and/or software operation such as the interaction with peripheral components or devices.

Software 1030 may include code to implement aspects of the present disclosure, including code to support parity bit channel assignment for polar coding. Software 1030 may be stored in a non-transitory computer-readable medium such as system memory or other memory. In some cases, the software 1030 may not be directly executable by the processor but may cause a computer (e.g., when compiled and executed) to perform functions described herein.

Transceiver 1035 may communicate bi-directionally, via one or more antennas, wired, or wireless links as described above. For example, the transceiver 1035 may represent a wireless transceiver and may communicate bi-directionally with another wireless transceiver. The transceiver 1035 may also include a modem to modulate the packets and provide the modulated packets to the antennas for transmission, and to demodulate packets received from the antennas.

In some cases, the wireless device may include a single antenna 1040. However, in some cases the device may have more than one antenna 1040, which may be capable of concurrently transmitting or receiving multiple wireless transmissions.

I/O controller 1045 may manage input and output signals for device 1005. I/O controller 1045 may also manage peripherals not integrated into device 1005. In some cases, I/O controller 1045 may represent a physical connection or port to an external peripheral. In some cases, I/O controller 1045 may utilize an operating system such as iOS®, ANDROID®, MS-DOS®, MS-WINDOWS®, OS/2®, UNIX®, LINUX®, or another known operating system. In other cases, I/O controller 1045 may represent or interact with a modem, a keyboard, a mouse, a touchscreen, or a similar device. In some cases, I/O controller 1045 may be implemented as part of a processor. In some cases, a user may interact with device 1005 via I/O controller 1045 or via hardware components controlled by I/O controller 1045.

Figure 11:
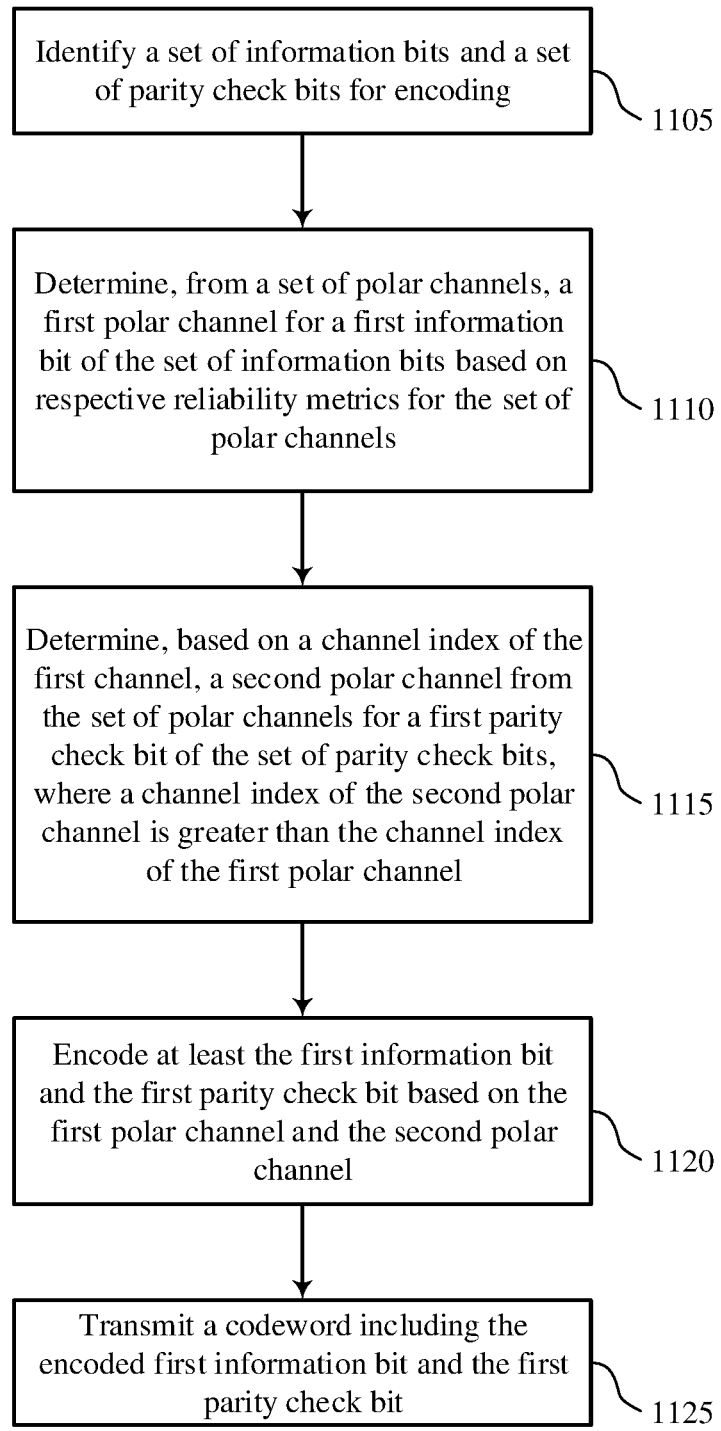
FIGS. 11 through 12 illustrate methods for parity bit channel assignment for polar coding in accordance with aspects of the present disclosure.

FIG. 11 shows a flowchart illustrating a method 1100 for parity bit channel assignment for polar coding in accordance with aspects of the present disclosure. The operations of method 1100 may be implemented by a base station 105 or UE 115 or its components as described herein. For example, the operations of method 1100 may be performed by a coding manager as described with reference to FIGS. 7 through 10. In some examples, a base station 105 or UE 115 may execute a set of codes to control the functional elements of the device to perform the functions described below. Additionally or alternatively, the base station 105 or UE 115 may perform aspects of the functions described below using special-purpose hardware.

At block 1105 the base station 105 or UE 115 may identify a set of information bits and a set of parity check bits for encoding. The operations of block 1105 may be performed according to the methods described with reference to FIGS. 1 through 5. In certain examples, aspects of the operations of block 1105 may be performed by a bit identifier as described with reference to FIGS. 7 through 10.

At block 1110 the base station 105 or UE 115 may determine, from a set of polar channels, a first polar channel for a first information bit of the set of information bits based at least in part on respective reliability metrics for the set of polar channels. The operations of block 1110 may be performed according to the methods described with reference to FIGS. 1 through 5. In certain examples, aspects of the operations of block 1110 may be performed by a info bit component as described with reference to FIGS. 7 through 10.

At block 1115 the base station 105 or UE 115 may determine, based at least in part on a channel index of the first polar channel, a second polar channel from the set of polar channels for a first parity check bit of the set of parity check bits, wherein a channel index of the second polar channel is greater than the channel index of the first polar channel. The operations of block 1115 may be performed according to the methods described with reference to FIGS. 1 through 5. In certain examples, aspects of the operations of block 1115 may be performed by a parity bit component as described with reference to FIGS. 7 through 10.

At block 1120 the base station 105 or UE 115 may encode at least the first information bit and the first parity check bit based at least in part on the first polar channel and the second polar channel. The operations of block 1120 may be performed according to the methods described with reference to FIGS. 1 through 5. In certain examples, aspects of the operations of block 1120 may be performed by a encoding component as described with reference to FIGS. 7 through 10.

At block 1125 the base station 105 or UE 115 may transmit a codeword comprising the encoded first information bit and the first parity check bit. The operations of block 1125 may be performed according to the methods described with reference to FIGS. 1 through 5. In certain examples, aspects of the operations of block 1125 may be performed by a codeword transmitter as described with reference to FIGS. 7 through 10.

Figure 12:
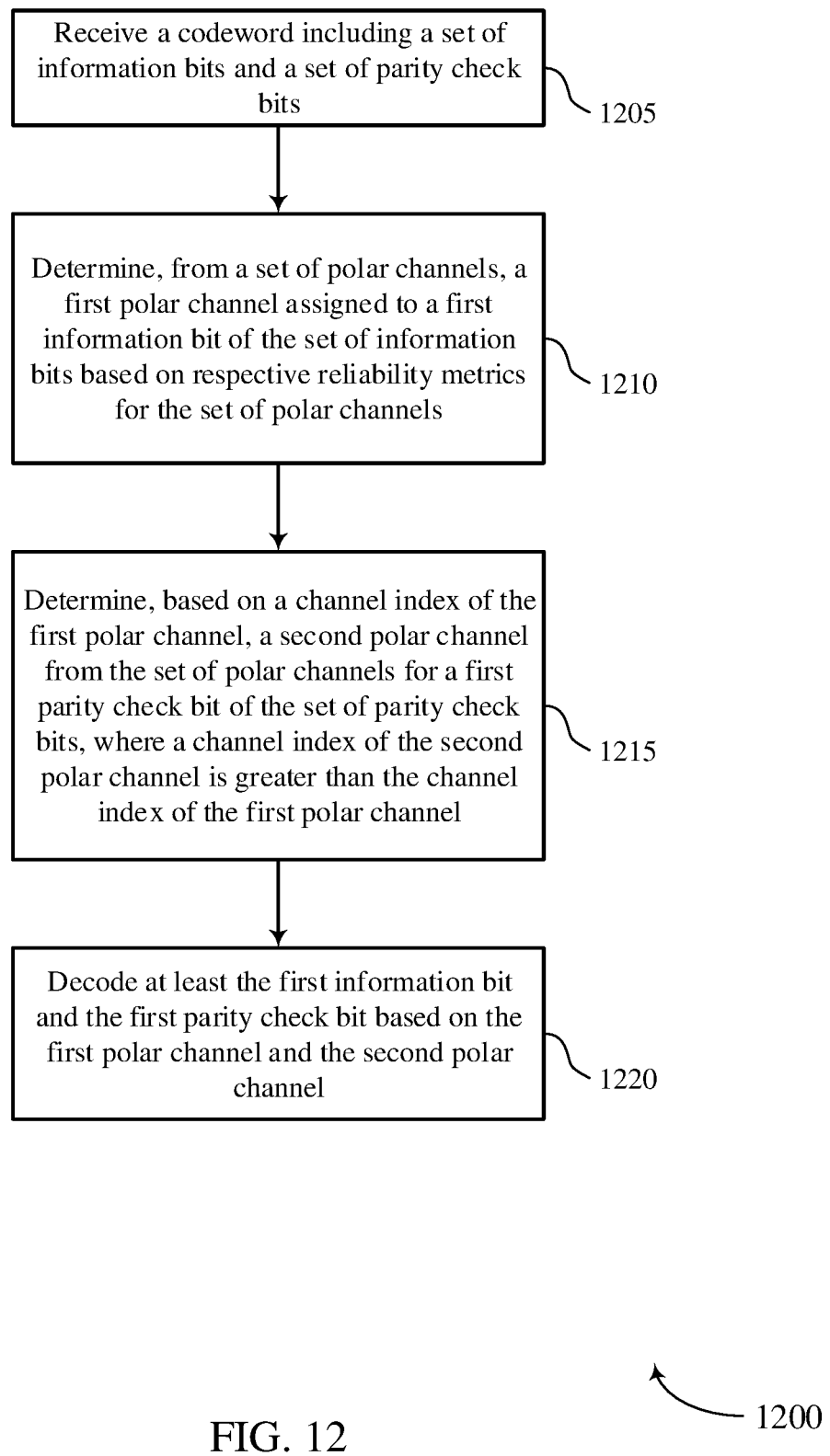

FIG. 12 shows a flowchart illustrating a method 1200 for parity bit channel assignment for polar coding in accordance with aspects of the present disclosure. The operations of method 1200 may be implemented by a base station 105 or UE 115 or its components as described herein. For example, the operations of method 1200 may be performed by a coding manager as described with reference to FIGS. 7 through 10. In some examples, a base station 105 or UE 115 may execute a set of codes to control the functional elements of the device to perform the functions described below. Additionally or alternatively, the base station 105 or UE 115 may perform aspects of the functions described below using special-purpose hardware.

At block 1205 the base station 105 UE 115 may receive a codeword comprising a set of information bits and a set of parity check bits. The operations of block 1205 may be performed according to the methods described with reference to FIGS. 1 through 5. In certain examples, aspects of the operations of block 1205 may be performed by a codeword component as described with reference to FIGS. 7 through 10.

At block 1210 the base station 105 or UE 115 may determine, from a set of polar channels, a first polar channel assigned to a first information bit of the set of information bits based at least in part on respective reliability metrics for the set of polar channels. The operations of block 1210 may be performed according to the methods described with reference to FIGS. 1 through 5. In certain examples, aspects of the operations of block 1210 may be performed by a info bit component as described with reference to FIGS. 7 through 10.

At block 1215 the base station 105 or UE 115 may determine, based at least in part on a channel index of the first polar channel, a second polar channel from the set of polar channels for a first parity check bit of the set of parity check bits, wherein a channel index of the second polar channel is greater than the channel index of the first polar channel. The operations of block 1215 may be performed according to the methods described with reference to FIGS. 1 through 5. In certain examples, aspects of the operations of block 1215 may be performed by a parity bit component as described with reference to FIGS. 7 through 10.

At block 1220 the base station 105 or UE 115 may decode at least the first information bit and the first parity check bit based at least in part on the first polar channel and the second polar channel. The operations of block 1220 may be performed according to the methods described with reference to FIGS. 1 through 5. In certain examples, aspects of the operations of block 1220 may be performed by a decoding component as described with reference to FIGS. 7 through 10.

It should be noted that the methods described above describe possible implementations, and that the operations and the steps may be rearranged or otherwise modified and that other implementations are possible. Furthermore, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. The terms "system" and "network" are often used interchangeably. A code division multiple access (CDMA) system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. 15-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WIMAX), IEEE 802.20, Flash-OFDM, etc. UTRA and E-UTRA are part of Universal Mobile Telecommunications System (UMTS). LTE and LTE-A are releases of UMTS that use E-UTRA. UTRA, E-UTRA, UMTS, LTE, LTE-A, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects of an LTE or an NR system may be described for purposes of example, and LTE or NR terminology may be used in much of the description, the techniques described herein are applicable beyond LTE or NR applications.

In LTE/LTE-A networks, including such networks described herein, the term evolved node B (eNB) may be generally used to describe the base stations. The wireless communications system or systems described herein may include a heterogeneous LTE/LTE-A or NR network in which different types of eNBs provide coverage for various geographical regions. For example, each eNB, next generation NodeB (gNB), or base station may provide communication coverage for a macro cell, a small cell, or other types of cell. The term "cell" may be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNodeB (eNB), gNB, Home NodeB, a Home eNodeB, or some other suitable terminology. The geographic coverage area for a base station may be divided into sectors making up only a portion of the coverage area. The wireless communications system or systems described herein may include base stations of different types (e.g., macro or small cell base stations). The UEs described herein may be able to communicate with various types of base stations and network equipment including macro eNBs, small cell eNBs, gNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pica eNB, a femto eNB, or a home eNB. An eNB may support one or multiple (e.g., two, three, four, and the like) cells (e.g., component carriers).

The wireless communications system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, wireless communications system 100 of FIG. 1—may include one or more carriers, where each carrier may be a signal made up of multiple sub-carriers (e.g., waveform signals of different frequencies).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communications, comprising:
   identifying a set of information bits and a set of parity check bits for encoding using a polar code having a set of polar channels;
   assigning the set of information bits to a first subset of the set of polar channels and the set of parity check bits to a second subset of the set of polar channels based at least in part on respective reliability metrics for the set of polar channels, wherein a parity check bit of the set of parity check bits is assigned to a polar channel based at least in part on a channel index of the polar channel; and
   encoding the set of information bits and the set of parity check bits based at least in part on the first and second subsets of polar channels of the set of polar channels.

2. The method of claim 1, further comprising:
   transmitting a codeword comprising the encoded set of information bits and the set of parity check bits.

3. The method of claim 1, wherein the polar channel is associated with a first reliability metric that is greater than a second reliability metric associated with the at least one polar channel.

4. The method of claim 1, further comprising:
   assigning the parity check bit to the polar channel based at least in part on a row weight of the polar channel.

5. The method of claim 1, wherein a number of the set of parity check bits is less than or equal to a number of polar channels having respective channel indices greater than the channel index of the at least one polar channel.

6. The method of claim 1, further comprising:
   determining, based at least in part on the channel index of the polar channel, respective channels of the set of polar channels for each parity check bit of the set of parity check bits; and
   encoding each parity check bit based at least in part on the respective channels.

7. The method of claim 6, wherein each index of the respective channels is greater than the channel index of at least one polar channel of the first subset of the set of polar channels.

8. A method for wireless communications, comprising:
   identifying a set of information bits and a set of parity check bits for decoding using a polar code having a set of polar channels;
   determining a first subset of the set of polar channels assigned to the set of information bits and a second subset of the set of polar channels assigned to the set of parity check bits based at least in part on respective reliability metrics for the set of polar channels, wherein a parity check bit of the set of parity check bits is assigned to a polar channel based at least in part on a channel index of the polar channel; and
   decoding the set of information bits and the set of parity check bits based at least in part on the first and second subsets of polar channels of the set of polar channels.

9. The method of claim 8, further comprising:
   receiving a codeword comprising the set of information bits and the set of parity check bits.

10. The method of claim 8, wherein the polar channel is associated with a first reliability metric that is greater than a second reliability metric associated with the at least one polar channel.

11. The method of claim 8, further comprising:
    assigning the parity check bit to the polar channel based at least in part on a row weight of the polar channel.

12. The method of claim 8, wherein a number of the set of parity check bits is less than or equal to a number of polar channels having respective channel indices greater than the channel index of the at least one polar channel.

13. The method of claim 8, further comprising:
    determining, based at least in part on the channel index of the polar channel, respective channels of the set of polar channels for each parity check bit of the set of parity check bits; and
    decoding each parity check bit based at least in part on the respective channels.

14. The method of claim 13, wherein each index of the respective channels is greater than the channel index of at least one polar channel of the first subset of the set of polar channels.

15. An apparatus for wireless communications, comprising:
a processor,
memory coupled with the processor; and
instructions stored in the memory and executable by the processor to cause the apparatus to:
identify a set of information bits and a set of parity check bits for encoding using a polar code having a set of polar channels;
assign the set of information bits to a first subset of the set of polar channels and the set of parity check bits to a second subset of the set of polar channels based at least in part on respective reliability metrics for the set of polar channels, wherein a parity check bit of the set of parity check bits is assigned to a polar channel based at least in part on a channel index of the polar channel; and
encode the set of information bits and the set of parity check bits based at least in part on the first and second subsets of polar channels of the set of polar channels.

16. The apparatus of claim 15, wherein the instructions are further executable by the processor to cause the apparatus to:
transmit a codeword comprising the encoded set of information bits and the set of parity check bits.

17. The apparatus of claim 15, wherein the polar channel is associated with a first reliability metric that is greater than a second reliability metric associated with the at least one polar channel.

18. The apparatus of claim 15, wherein the instructions are further executable by the processor to cause the apparatus to:
assign the parity check bit to the polar channel based at least in part on a row weight of the polar channel.

19. The apparatus of claim 15, wherein a number of the set of parity check bits is less than or equal to a number of polar channels having respective channel indices greater than the channel index of the at least one polar channel.

20. The apparatus of claim 15, wherein the instructions are further executable by the processor to cause the apparatus to:
determine, based at least in part on the channel index of the polar channel, respective channels of the set of polar channels for each parity check bit of the set of parity check bits; and
encode each parity check bit based at least in part on the respective channels.

21. The apparatus of claim 20, wherein each index of the respective channels is greater than the channel index of at least one polar channel of the first subset of the set of polar channels.

22. An apparatus for wireless communications, comprising:
a processor,
memory coupled with the processor; and
instructions stored in the memory and executable by the processor to cause the apparatus to:
identify a set of information bits and a set of parity check bits for decoding using a polar code having a set of polar channels;
determine a first subset of the set of polar channels assigned to the set of information bits and a second subset of the set of polar channels assigned to the set of parity check bits based at least in part on respective reliability metrics for the set of polar channels, wherein a parity check bit of the set of parity check bits is assigned to a polar channel based at least in part on a channel index of the polar channel; and
decode the set of information bits and the set of parity check bits based at least in part on the first and second subsets of polar channels of the set of polar channels.

23. The apparatus of claim 22, wherein the instructions are further executable by the processor to cause the apparatus to:
receive a codeword comprising the set of information bits and the set of parity check bits.

24. The apparatus of claim 22, wherein the polar channel is associated with a first reliability metric that is greater than a second reliability metric associated with the at least one polar channel.

25. The apparatus of claim 22, wherein the instructions are further executable by the processor to cause the apparatus to:
assign the parity check bit to the polar channel based at least in part on a row weight of the polar channel.

26. The apparatus of claim 22, wherein a number of the set of parity check bits is less than or equal to a number of polar channels having respective channel indices greater than the channel index of the at least one polar channel.

27. The apparatus of claim 22, wherein the instructions are further executable by the processor to cause the apparatus to:
determine, based at least in part on the channel index of the polar channel, respective channels of the set of polar channels for each parity check bit of the set of parity check bits; and
decode each parity check bit based at least in part on the respective channels.

28. The apparatus of claim 27, wherein each index of the respective channels is greater than the channel index of at least one polar channel of the first subset of the set of polar channels.

* * * * *